(12) United States Patent
Kim et al.

(10) Patent No.: US 11,551,604 B2
(45) Date of Patent: Jan. 10, 2023

(54) SCAN DRIVER AND DISPLAY DEVICE

(71) Applicant: SAMSUNG DISPLAY CO., LTD., Yongin-si (KR)

(72) Inventors: Sunghwan Kim, Yongin-si (KR); Jung Hoon Shim, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/382,471

(22) Filed: Jul. 22, 2021

(65) Prior Publication Data
US 2022/0036802 A1 Feb. 3, 2022

(30) Foreign Application Priority Data

Jul. 30, 2020 (KR) .................. 10-2020-0095389

(51) Int. Cl.
*G09G 3/3266* (2016.01)
*G09G 3/20* (2006.01)

(52) U.S. Cl.
CPC ... *G09G 3/2092* (2013.01); *G09G 2310/0267* (2013.01); *G09G 2310/0275* (2013.01)

(58) Field of Classification Search
CPC ......... G09G 3/2092; G09G 2310/0267; G09G 2310/0275; G09G 3/3266; G09G 3/3677; G09G 2300/0426; G09G 3/20; G09G 2310/0286; G09G 2310/08; G09G 2310/0264; G09G 2310/06; G11C 19/28
See application file for complete search history.

(56) References Cited

U.S. PATENT DOCUMENTS

| | | | | |
|---|---|---|---|---|
| 6,246,387 B1* | 6/2001 | Yamazaki | ............ | G09G 3/3677 345/206 |
| 7,221,197 B2* | 5/2007 | Morita | ............ | G11C 19/28 345/98 |
| 7,956,829 B2* | 6/2011 | Iida | ............ | G09G 3/3233 345/82 |
| 8,089,446 B2* | 1/2012 | Pak | ............ | G09G 3/3677 345/100 |

(Continued)

OTHER PUBLICATIONS

Hyung Nyuck Cho et al., "Amorphous-silicon gate-driver circuits of shared-node dual pull-down structure with overlapped output signals", Journal of the SID, 2008.

(Continued)

*Primary Examiner* — Jose R Soto Lopez
(74) *Attorney, Agent, or Firm* — F. Chau & Associates, LLC

(57) ABSTRACT

A scan driver of a display device includes a plurality of stages. Each stage includes a clock line configured to receive a first clock signal and a second clock signal having different phases, a shared input circuit configured to transfer an input signal to a shared control node, a first output circuit coupled to the shared control node, configured to transfer a voltage of the shared control node to a first control node, and configured to output a first scan signal in response to a voltage of the first control node and the first clock signal, and a second output circuit coupled to the shared control node, configured to transfer the voltage of the shared control node to a second control node, and configured to output a second scan signal in response to a voltage of the second control node and the second clock signal.

20 Claims, 19 Drawing Sheets

(56) References Cited

U.S. PATENT DOCUMENTS

| | | | |
|---|---|---|---|
| 10,276,121 B2 | 4/2019 | Kim et al. | |
| 11,081,199 B2* | 8/2021 | Feng | G11C 19/28 |
| 11,200,825 B2* | 12/2021 | Feng | G09G 3/20 |
| 11,222,596 B2* | 1/2022 | Kim | G11C 19/28 |
| 2006/0267889 A1* | 11/2006 | Kimura | G09G 3/3258 345/84 |
| 2007/0279360 A1* | 12/2007 | Park | G09G 3/3696 345/94 |
| 2009/0002282 A1* | 1/2009 | Tomida | G09G 3/3233 345/76 |
| 2009/0046085 A1* | 2/2009 | Ino | G09G 3/3674 345/208 |
| 2009/0121974 A1* | 5/2009 | Yamashita | G09G 3/3266 345/55 |
| 2009/0322737 A1* | 12/2009 | Kim | G09G 3/3677 345/215 |
| 2012/0327131 A1* | 12/2012 | Jang | G09G 3/3266 327/427 |
| 2013/0002630 A1* | 1/2013 | Lee | G11C 19/28 327/108 |
| 2013/0148775 A1* | 6/2013 | Shin | G11C 19/28 377/69 |
| 2014/0091998 A1* | 4/2014 | Ko | G09G 3/3674 345/100 |
| 2015/0077407 A1* | 3/2015 | Kim | G09G 3/3611 345/204 |
| 2016/0141051 A1* | 5/2016 | Chen | G11C 19/28 377/75 |
| 2016/0294390 A1* | 10/2016 | Liao | H03K 19/00315 |
| 2016/0358666 A1* | 12/2016 | Pang | G11C 19/287 |
| 2017/0084222 A1* | 3/2017 | Sun | G09G 3/32 |
| 2017/0098420 A1* | 4/2017 | Kang | H03K 17/6871 |
| 2017/0186360 A1* | 6/2017 | Ma | G09G 3/3266 |
| 2017/0193957 A1* | 7/2017 | Liu | G09G 3/3696 |
| 2017/0278451 A1* | 9/2017 | Peng | G09G 3/3677 |
| 2018/0047360 A1* | 2/2018 | Cai | G09G 3/2096 |
| 2018/0190180 A1* | 7/2018 | Shang | G09G 3/3266 |
| 2018/0190181 A1* | 7/2018 | Zhao | G09G 3/20 |
| 2018/0197455 A1* | 7/2018 | Han | G09G 3/2085 |
| 2018/0240382 A1* | 8/2018 | Choi | H03F 3/3022 |
| 2018/0240432 A1* | 8/2018 | Zhao | G09G 3/3677 |
| 2018/0336957 A1* | 11/2018 | Mi | G09G 3/3266 |
| 2018/0348922 A1* | 12/2018 | Luo | G06F 3/0412 |
| 2019/0005866 A1* | 1/2019 | Li | G09G 3/20 |
| 2019/0035322 A1* | 1/2019 | Kim | G09G 3/3233 |
| 2019/0043400 A1* | 2/2019 | Huang | G09G 3/3266 |
| 2019/0080780 A1* | 3/2019 | Wang | G11C 19/287 |
| 2019/0103166 A1* | 4/2019 | Yuan | G11C 19/184 |
| 2019/0130857 A1* | 5/2019 | Ma | G09G 3/3677 |
| 2019/0189233 A1* | 6/2019 | Su | G11C 19/287 |
| 2019/0333597 A1* | 10/2019 | Liu | G11C 19/287 |
| 2020/0020264 A1* | 1/2020 | Chen | G11C 19/28 |
| 2020/0020266 A1* | 1/2020 | Feng | G11C 19/28 |
| 2020/0066210 A1* | 2/2020 | Yuan | G09G 3/3266 |
| 2020/0075113 A1* | 3/2020 | Yuan | G11C 19/28 |
| 2020/0135287 A1* | 4/2020 | Han | G09G 3/3677 |
| 2020/0168142 A1* | 5/2020 | Wang | G09G 3/20 |
| 2020/0357346 A1* | 11/2020 | Pyun | G09G 3/3291 |
| 2021/0065632 A1* | 3/2021 | Kim | G09G 3/3233 |
| 2021/0110774 A1* | 4/2021 | Cho | G09G 3/3266 |
| 2021/0225256 A1* | 7/2021 | Byun | G09G 3/20 |
| 2021/0383737 A1* | 12/2021 | Byun | G11C 19/184 |
| 2022/0114938 A1* | 4/2022 | Feng | G09G 3/20 |
| 2022/0114941 A1* | 4/2022 | Gan | G09G 3/3677 |
| 2022/0114970 A1* | 4/2022 | Feng | G09G 3/3266 |

OTHER PUBLICATIONS

Binn Kim et al., "A novel depletion mode a-IGZO TFT shift register with a node shared structure", IEEE Electron Device Letter, vol. 33, No. 7, Jul. 2012.

H. Nam et al., "Node sharing low temperature poly silicon TFT shift register without bootstrapping degradation for narrow bezel displays", Electronics Letters, Oct. 4, 2018, vol. 54, No. 20, pp. 1162-1164.

* cited by examiner

SCAN DRIVER AND DISPLAY DEVICE

CROSS-REFERENCE TO RELATED APPLICATION(S)

This application claims priority under 35 USC § 119 to Korean Patent Application No. 10-2020-0095389, filed on Jul. 30, 2020 in the Korean Intellectual Property Office (KIPO), the content of which is herein incorporated by reference in its entirety.
SCA

FIELD

The present inventive concept generally relates to display devices, and more particularly relates to a scan driver for a display device.

DISCUSSION OF RELATED ART

A scan driver of a display device may include a plurality of stages that outputs a plurality of scan signals to a plurality of pixel rows of a display panel. In general, the scan driver may include a plurality of stages of which the number is substantially the same as the number of the pixel rows, and each stage may output one scan signal to one corresponding pixel row.

SUMMARY

An embodiment provides a scan driver having a small size.

An embodiment provides a display device including a scan driver having a small size.

According to an embodiment, a scan driver includes a plurality of stages. Each stage includes at least one clock line configured to receive a first clock signal and a second clock signal having different phases; a shared input circuit configured to transfer an input signal to a shared control node; a first output circuit coupled to the shared control node, configured to transfer a voltage of the shared control node to a first control node, and configured to output a first scan signal in response to a voltage of the first control node and the first clock signal; and a second output circuit coupled to the shared control node, configured to transfer the voltage of the shared control node to a second control node, and configured to output a second scan signal in response to a voltage of the second control node and the second clock signal.

In an embodiment, the shared input circuit may include a first transistor including a gate receiving the input signal, a first terminal receiving the input signal, and a second terminal coupled to the shared control node.

In an embodiment, the shared input circuit may include a first transistor including a gate receiving the second clock signal, a first terminal receiving the input signal, and a second terminal coupled to the shared control node.

In an embodiment, the first output circuit and the second output circuit may be commonly coupled to a shared inverted control node, the first output circuit may transfer a gate-off voltage to a first output node at which the first scan signal is output in response to a voltage of the shared inverted control node, and the second output circuit may transfer the gate-off voltage to a second output node at which the second scan signal is output in response to the voltage of the shared inverted control node.

In an embodiment, the first output circuit may include a second transistor including a gate receiving a gate-on voltage, a first terminal coupled to the shared control node, and a second terminal coupled to the first control node, a third transistor including a gate coupled to the first control node, a first terminal receiving the first clock signal, and a second terminal coupled to a first output node at which the first scan signal is output, a first capacitor including a first electrode coupled to the first control node, and a second electrode coupled to the first output node, and a fourth transistor including a gate coupled to a shared inverted control node, a first terminal coupled to the first output node, and a second terminal receiving a gate-off voltage.

In an embodiment, the second output circuit may include a fifth transistor including a gate receiving the first clock signal, a first terminal coupled to the shared control node, and a second terminal coupled to the second control node, a sixth transistor including a gate coupled to the second control node, a first terminal receiving the second clock signal, and a second terminal coupled to a second output node at which the second scan signal is output, a second capacitor including a first electrode coupled to the second control node, and a second electrode coupled to the second output node, and a seventh transistor including a gate coupled to a shared inverted control node, a first terminal coupled to the second output node, and a second terminal receiving a gate-off voltage.

In an embodiment, the second output circuit may further include a thirteenth transistor coupled between the second terminal of the fifth transistor and the second control node, and including a gate receiving a gate-on voltage, a first terminal coupled to the second terminal of the fifth transistor, and a second terminal coupled to the second control node.

In an embodiment, each stage may further include a shared stabilizer circuit configured to transfer a gate-off voltage to the shared control node in response to a voltage of a shared inverted control node.

In an embodiment, the shared stabilizer circuit may include an eighth transistor including a gate coupled to the shared inverted control node, a first terminal coupled to the shared control node, and a second terminal receiving the gate-off voltage.

In an embodiment, each stage may further include a shared inverter circuit configured to control a shared inverted control node in response to the first clock signal and the first scan signal.

In an embodiment, the shared inverter circuit may include a ninth transistor including a gate receiving the first clock signal, a first terminal receiving the first clock signal, and a second terminal, a tenth transistor including a gate coupled to the second terminal of the ninth transistor, a first terminal receiving the first clock signal, and a second terminal coupled to the shared inverted control node, an eleventh transistor including a gate coupled to a first output node at which the first scan signal is output, a first terminal coupled to the gate of the tenth transistor, and a second terminal receiving a gate-off voltage, and a twelfth transistor including a gate coupled to the first output node, a first terminal coupled to the shared inverted control node, and a second terminal receiving the gate-off voltage.

In an embodiment, each stage may further include a shared inverter circuit configured to control a shared inverted control node in response to the first clock signal and the voltage of the shared control node.

In an embodiment, the shared inverter circuit may include a ninth transistor including a gate receiving the first clock signal, a first terminal receiving the first clock signal, and a second terminal, a tenth transistor including a gate coupled to the second terminal of the ninth transistor, a first terminal receiving the first clock signal, and a second terminal coupled to the shared inverted control node, an eleventh transistor including a gate coupled to the shared control node, a first terminal coupled to the gate of the tenth transistor, and a second terminal receiving a gate-off voltage, a twelfth transistor including a gate coupled to the shared control node, a first terminal coupled to the shared inverted control node, and a second terminal receiving the gate-off voltage, and a third capacitor including a first electrode coupled to the shared inverted control node, and a second electrode receiving the gate-off voltage.

In an embodiment, transistors included in at least one of the first output circuit or the second output circuit of the scan driver may be NMOS transistors, and transistors included in at least the other of the first output circuit or the second output circuit may be PMOS transistors.

In an embodiment, transistors included in at least one of the shared input circuit, the shared stabilizer circuit or the shared inverter circuit of the scan driver may be PMOS transistors, and transistors included in at least another of the shared input circuit, the shared stabilizer circuit or the shared inverter circuit may be NMOS transistors.

According to an embodiment, a scan driver includes a plurality of stages. Each stage includes at least one clock line configured to receive a first clock signal and a second clock signal having different phases; a first transistor including a gate receiving an input signal or the second clock signal, a first terminal receiving the input signal, and a second terminal coupled to a shared control node; a second transistor including a gate receiving a gate-on voltage, a first terminal coupled to the shared control node, and a second terminal coupled to a first control node; a third transistor including a gate coupled to the first control node, a first terminal receiving the first clock signal, and a second terminal coupled to a first output node at which a first scan signal is output; a first capacitor including a first electrode coupled to the first control node, and a second electrode coupled to the first output node; a fourth transistor including a gate coupled to a shared inverted control node, a first terminal coupled to the first output node, and a second terminal receiving a gate-off voltage; a fifth transistor including a gate receiving the first clock signal, a first terminal coupled to the shared control node, and a second terminal coupled to a second control node; a sixth transistor including a gate coupled to the second control node, a first terminal receiving the second clock signal, and a second terminal coupled to a second output node at which a second scan signal is output; a second capacitor including a first electrode coupled to the second control node, and a second electrode coupled to the second output node; and a seventh transistor including a gate coupled to the shared inverted control node, a first terminal coupled to the second output node, and a second terminal receiving the gate-off voltage.

In an embodiment, each stage may further include an eighth transistor including a gate coupled to the shared inverted control node, a first terminal coupled to the shared control node, and a second terminal receiving the gate-off voltage, a ninth transistor including a gate receiving the first clock signal, a first terminal receiving the first clock signal, and a second terminal, a tenth transistor including a gate coupled to the second terminal of the ninth transistor, a first terminal receiving the first clock signal, and a second terminal coupled to the shared inverted control node, an eleventh transistor including a gate coupled to the shared control node, a first terminal coupled to the gate of the tenth transistor, and a second terminal receiving the gate-off voltage, and a twelfth transistor including a gate coupled to the first output node, a first terminal coupled to the shared inverted control node, and a second terminal receiving the gate-off voltage.

In an embodiment, each stage may further include a thirteenth transistor coupled between the second terminal of the fifth transistor and the second control node, and including a gate receiving the gate-on voltage, a first terminal coupled to the second terminal of the fifth transistor, and a second terminal coupled to the second control node.

In an embodiment, each stage may further include an eighth transistor including a gate coupled to the shared inverted control node, a first terminal coupled to the shared control node, and a second terminal receiving the gate-off voltage, a ninth transistor including a gate receiving the first clock signal, a first terminal receiving the first clock signal, and a second terminal, a tenth transistor including a gate coupled to the second terminal of the ninth transistor, a first terminal receiving the first clock signal, and a second terminal coupled to the shared inverted control node, an eleventh transistor including a gate coupled to the shared control node, a first terminal coupled to the gate of the tenth transistor, and a second terminal receiving the gate-off voltage, a twelfth transistor including a gate coupled to the shared control node, a first terminal coupled to the shared inverted control node, and a second terminal receiving the gate-off voltage, and a third capacitor including a first electrode coupled to the shared inverted control node, and a second electrode receiving the gate-off voltage.

According to an embodiment, there is provided a display device including a display panel including a plurality of pixels, a data driver configured to provide data signals to the plurality of pixels, a scan driver configured to provide scan signals to the plurality of pixels, and including a plurality of stages, and a controller configured to control the data driver and the scan driver. Each of the plurality of stages includes at least one clock line configured to receive a first clock signal and a second clock signal having different phases; a shared input circuit configured to transfer an input signal to a shared control node; a first output circuit coupled to the shared control node, configured to transfer a voltage of the shared control node to a first control node, and configured to output a first scan signal of the scan signals in response to a voltage of the first control node and the first clock signal; and a second output circuit coupled to the shared control node, configured to transfer the voltage of the shared control node to a second control node, and configured to output a second scan signal of the scan signals in response to a voltage of the second control node and the second clock signal.

As described above, in a scan driver and a display device according to an embodiment, first and second output circuits may share a shared control node and/or a shared inverted control node, the first output circuit may output a first scan signal in synchronization with a first clock signal, and the second output circuit may output a second scan signal in synchronization with a second clock signal. Accordingly, each stage of the scan driver may output two scan signals to two pixel rows by using two clock signals, and a size of the scan driver may be reduced compared with a size of a scan driver where each stage outputs one scan signal.

BRIEF DESCRIPTION OF THE DRAWINGS

Illustrative, non-limiting embodiments will be more clearly understood from the following detailed description considered in conjunction with the accompanying drawings.

DETAILED DESCRIPTION

Hereinafter, embodiments of the present inventive concept will be explained in greater detail with reference to the accompanying drawings.

Figure 1:
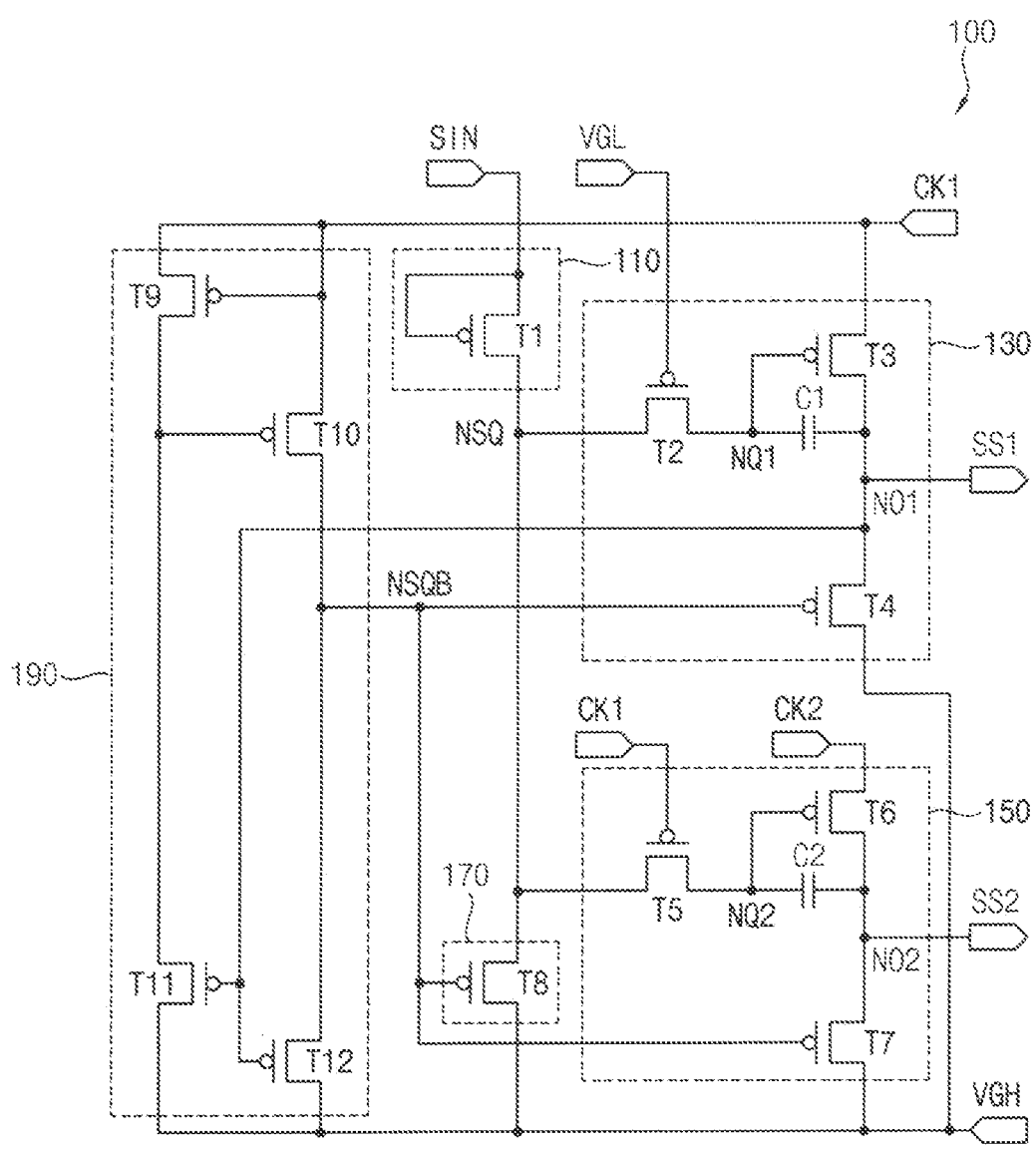
FIG. 1 is a circuit diagram illustrating each stage included in a scan driver according to an embodiment.

FIG. 1 illustrates each stage included in a scan driver according to an embodiment.

Referring to FIG. 1, a scan driver according to an embodiment may include a plurality of stages, where each stage 100 receives through at least one clock line a first clock signal CK1 and a second clock signal CK2 having different phases from each other, and each stage 100 may include a shared input circuit 110, a first output circuit 130 and a second output circuit 150. In an embodiment, the first clock signal CK1 and the second clock signal CK2 may have opposite phases. In an embodiment, each stage 100 may further include a shared stabilizer circuit 170 and a shared inverter circuit 190.

The shared input circuit 110 may transfer an input signal SIN to a shared control node NSQ. In an embodiment, a first stage of the plurality of stages may receive a scan start signal as the input signal SIN, and each of the remaining stages may receive a respective second scan signal SS2 of a previous stage as the input signal SIN. In an embodiment, the shared input circuit 110 may receive the input signal SIN that is synchronized with the second clock signal CK2. In an embodiment, as illustrated in FIG. 1, the shared input circuit 110 may include a first transistor T1 including a gate receiving the input signal SIN, a first terminal receiving the input signal SIN, and a second terminal coupled to the shared control node NSQ. Thus, the gate and the first terminal of the first transistor T1 are coupled to each other, and thus the first transistor T1 may be diode-connected.

The first output circuit 130 and the second output circuit 150 may be commonly coupled to the shared control node NSQ. Further, the first output circuit 130 and the second output circuit 150 may be commonly coupled to a shared inverted control node NSQB. The first output circuit 130 may output a first scan signal SS1 to a first pixel row (e.g., a first row of pixels) in synchronization with the first clock signal CK1 based on a voltage of the shared control node NSQ, a gate-on voltage (e.g., a low gate voltage) VGL and the first clock signal CK1, and the second output circuit 150 may output the second scan signal SS2 to a second pixel row (e.g., a second row of pixels) different from the first pixel row in synchronization with the second clock signal CK2 based on the voltage of the shared control node NSQ, the first clock signal CK1 and the second clock signal CK2.

The first output circuit 130 may be coupled to the shared control node NSQ, and may transfer the voltage of the shared control node NSQ to a first control node NQ1. For example, the first output circuit 130 may transfer the voltage of the shared control node NSQ to the first control node NQ1 by using a second transistor T2 that is turned on based on the gate-on voltage VGL. The first output circuit 130 may output the first scan signal SS1 to the first pixel row in response to a voltage of the first control node NQ1 and the first clock signal CK1. For example, the first output circuit 130 may bootstrap the first control node NQ1 in response to the first clock signal CK1 having a first on level (e.g., a first low level) to change the voltage of the first control node NQ1 from the first on level to a second on level having an absolute value greater than that of the first on level (e.g., from the first low level to a second low level lower than the first low level), and may output the first clock signal CK1 having the first on level as the first scan signal SS1 based on the voltage of the first control node NQ1 having the second on level. The first output circuit 130 may transfer a gate-off voltage (e.g., a high gate voltage) VGH to a first output node NO1 at which the first scan signal SS1 is output in response to a voltage of the shared inverted control node NSQB.

In an embodiment, as illustrated in FIG. 1, the first output circuit 130 may include a second transistor T2 including a gate receiving the gate-on voltage VGL, a first terminal coupled to the shared control node NSQ, and a second terminal coupled to the first control node NQ1; a third transistor T3 including a gate coupled to the first control node NQ1, a first terminal receiving the first clock signal CK1, and a second terminal coupled to the first output node NO1 at which the first scan signal SS1 is output; a first capacitor C1 including a first electrode coupled to the first control node NQ1, and a second electrode coupled to the first output node NO1; and a fourth transistor T4 including a gate coupled to the shared inverted control node NSQB, a first terminal coupled to the first output node NO1, and a second terminal receiving the gate-off voltage VGH.

The second output circuit 150 may be coupled to the shared control node NSQ, and may transfer the voltage of the shared control node NSQ to a second control node NQ2. For example, the second output circuit 150 may transfer the voltage of the shared control node NSQ to the second control node NQ2 by using a fifth transistor T5 that is turned on based on the first clock signal CK1. The second output circuit 150 may output the second scan signal SS2 to the second pixel row in response to a voltage of the second control node NQ2 and the second clock signal CK2. For example, the second output circuit 150 may bootstrap the second control node NQ2 in response to the second clock signal CK2 having the first on level to change the voltage of the second control node NQ2 from the first on level to the second on level having an absolute value greater than that of the first on level, and may output the second clock signal CK2 having the first on level as the second scan signal SS2 based on the voltage of the second control node NQ2 having the second on level. The second output circuit 150 may transfer the gate-off voltage VGH to a second output node NO2 at which the second scan signal SS2 is output in response to the voltage of the shared inverted control node NSQB.

In an embodiment, as illustrated in FIG. 1, the second output circuit 150 may include a fifth transistor T5 including a gate receiving the first clock signal CK1, a first terminal coupled to the shared control node NSQ, and a second terminal coupled to the second control node NQ2; a sixth transistor T6 including a gate coupled to the second control node NQ2, a first terminal receiving the second clock signal CK2, and a second terminal coupled to the second output node NO2 at which the second scan signal SS2 is output; a second capacitor C2 including a first electrode coupled to the second control node NQ2, and a second electrode coupled to the second output node NO2; and a seventh transistor T7 including a gate coupled to the shared inverted control node NSQB, a first terminal coupled to the second output node NO2, and a second terminal receiving the gate-off voltage VGH.

The shared stabilizer circuit 170 may transfer the gate-off voltage VGH to the shared control node NSQ in response to the voltage of the shared inverted control node NSQB. For example, the voltage of the shared inverted control node NSQB may periodically have the first on level before and/or after the first and second scan signals SS1 and SS2 are output, and the shared stabilizer circuit 170 may periodically transfer the gate-off voltage VGH to the shared control node NSQ in response to the voltage of the shared inverted control node NSQB having the first on level. In an embodiment, as illustrated in FIG. 1, the shared stabilizer circuit 170 may include an eighth transistor T8 including a gate coupled to the shared inverted control node NSQB, a first terminal coupled to the shared control node NSQ, and a second terminal receiving the gate-off voltage VGH.

The shared inverter circuit 190 may control the shared inverted control node NSQB in response to the first clock signal CK1 and the first scan signal SS1. For example, the shared inverter circuit 190 may cause the voltage of the shared inverted control node NSQB to have the first on level in response to the first clock signal CK1 having the first on level before and/or after the first and second scan signals SS1 and SS2 are output. While the first scan signal SS1 having the first on level is output, although the first clock signal CK1 has the first on level, the shared inverter circuit 190 may cause the voltage of the shared inverted control node NSQB to have an off level (e.g., a high level). In an embodiment, as illustrated in FIG. 1, the shared inverter circuit 190 may include a ninth transistor T9 including a gate receiving the first clock signal CK1, a first terminal receiving the first clock signal CK1, and a second terminal; a tenth transistor T10 including a gate coupled to the second terminal of the ninth transistor T9, a first terminal receiving the first clock signal CK1, and a second terminal coupled to the shared inverted control node NSQB; an eleventh transistor T11 including a gate coupled to the first output node NO1 at which the first scan signal SS1 is output, a first terminal coupled to the gate of the tenth transistor T10, and a second terminal receiving the gate-off voltage VGH; and a twelfth transistor T12 including a gate coupled to the first output node NO1, a first terminal coupled to the shared inverted control node NSQB, and a second terminal receiving the gate-off voltage VGH.

Figure 12:
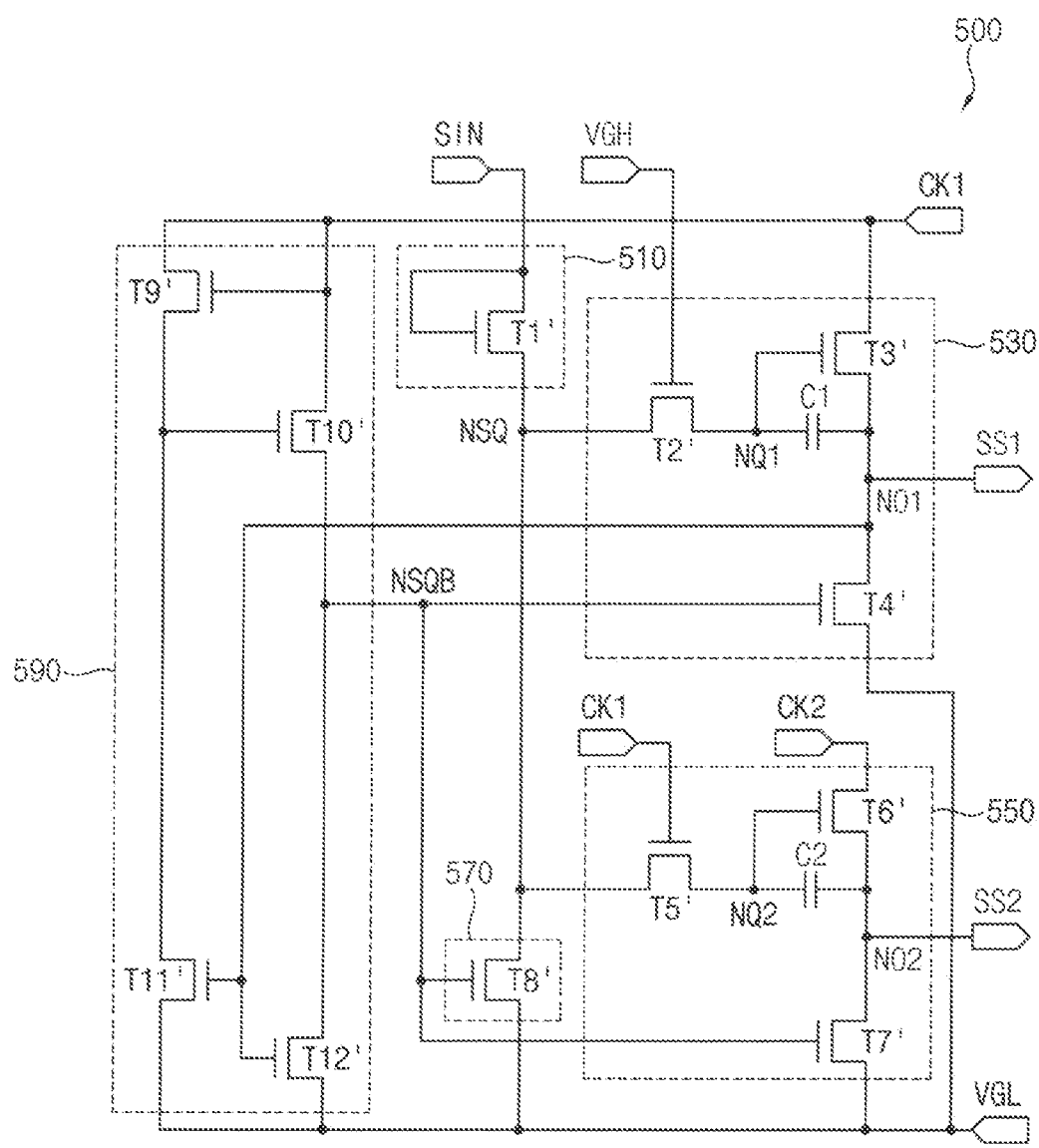
FIG. 12 is a circuit diagram illustrating each stage included in a scan driver according to an embodiment.
Figure 14:
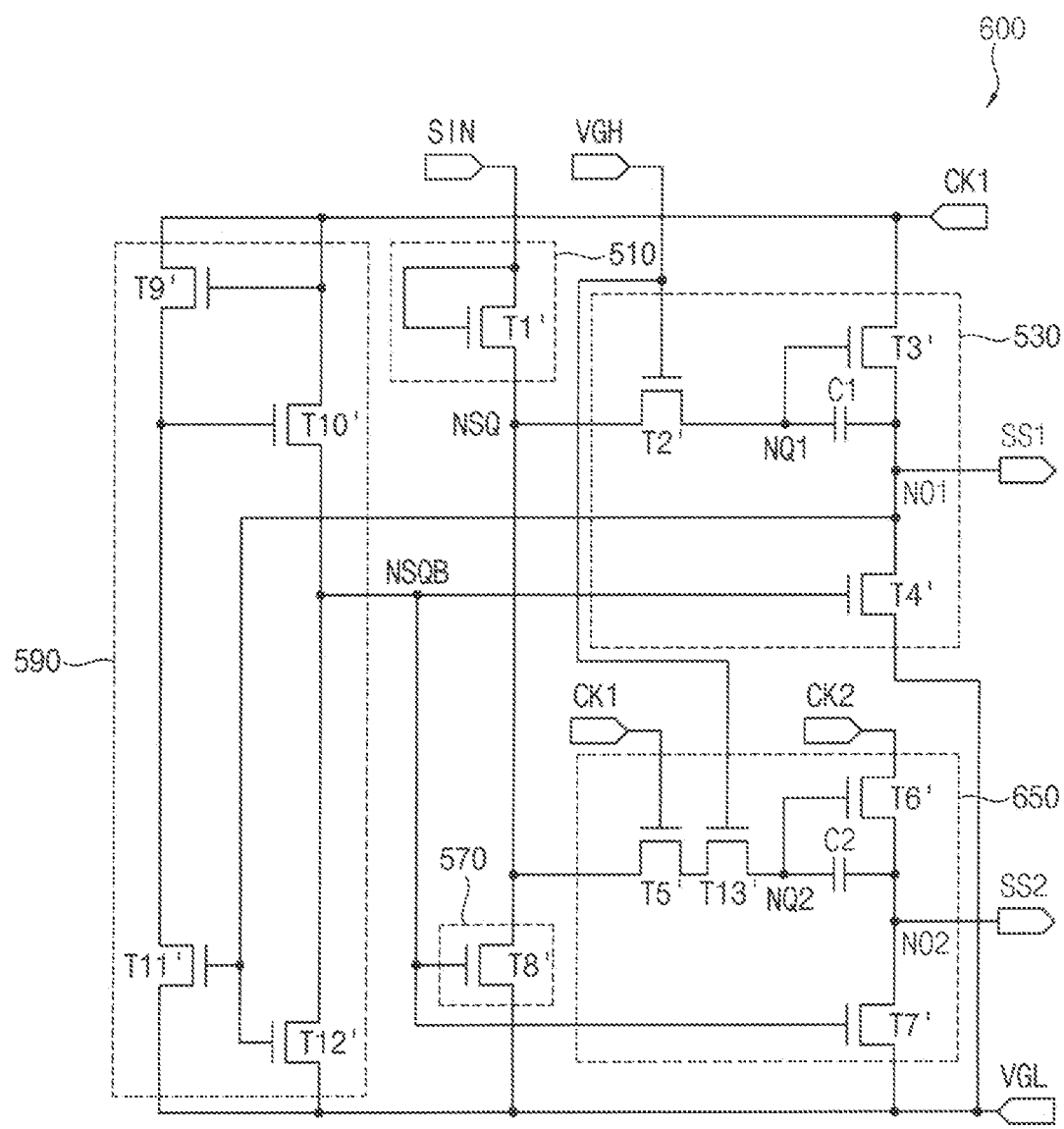
FIG. 14 is a circuit diagram illustrating each stage included in a scan driver according to an embodiment.
Figure 15:
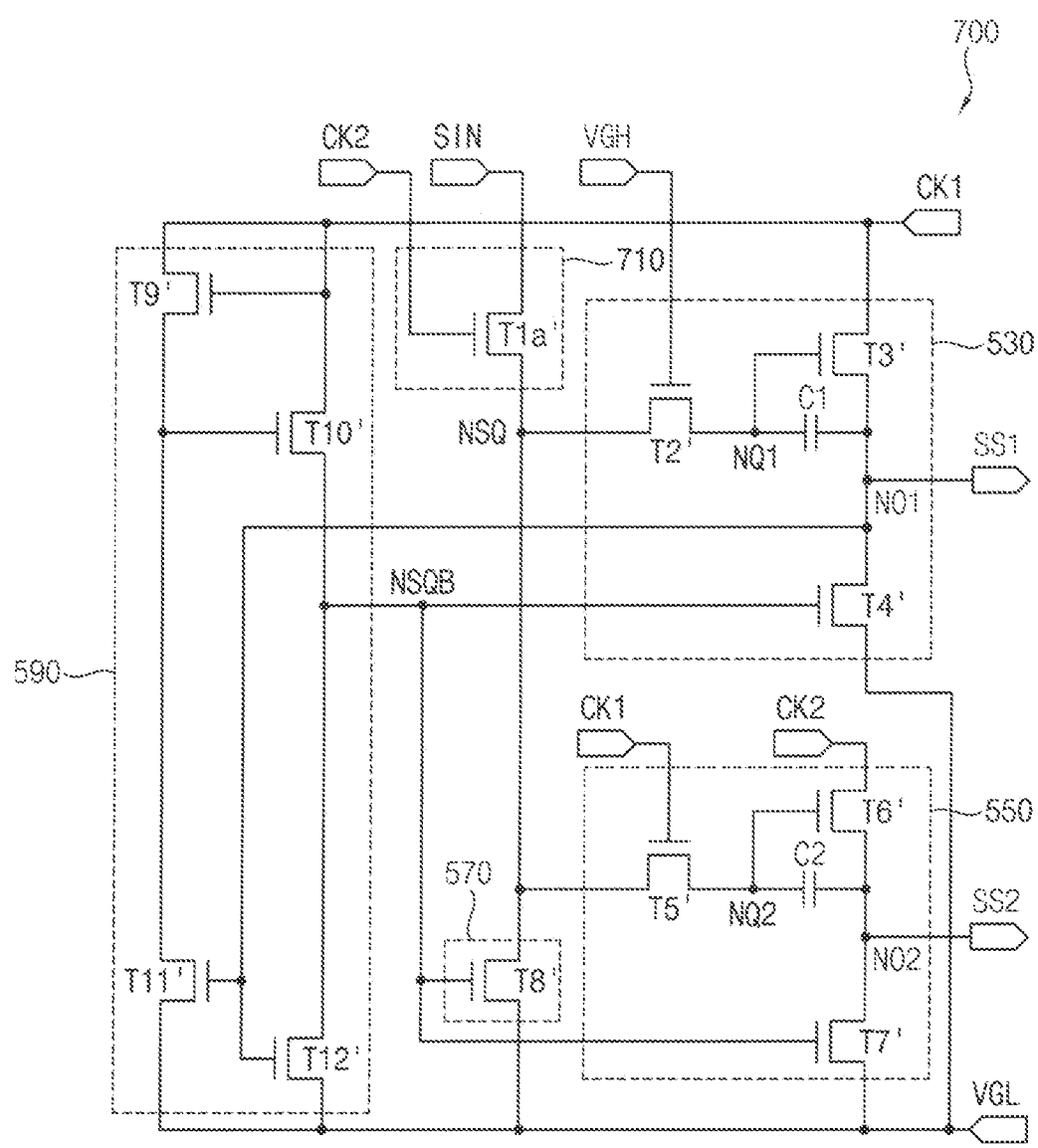
FIG. 15 is a circuit diagram illustrating each stage included in a scan driver according to an embodiment.

In an embodiment, as illustrated in FIG. 1, transistors T1, T2, T3, T4, T5, T6, T7, T8, T9, T10, T11 and T12 included in the scan driver or each stage 100 may be, but need not be limited to, PMOS transistors. In an embodiment, as illustrated in FIGS. 12, 14, 15 and/or 16, transistors included in the scan driver may be, but need not be limited to, NMOS transistors.

As described above, in the scan driver according to an embodiment, the first and second output circuits 130 and 150 of each stage 100 may share the shared control node NSQ and the shared inverted control node NSQB, the first output circuit 130 may output the first scan signal SS1 in synchronization with the first clock signal CK1, and the second output circuit 150 may output the second scan signal SS2 in synchronization with the second clock signal CK2. Accordingly, each stage 100 of the scan driver may output two scan signals SS1 and SS2 to two pixel rows by using only two clock signals CK1 and CK2, and a size of the scan driver may be reduced compared with a size of a scan driver where each stage outputs one scan signal.

Hereinafter, an example of an operation of the stage 100 will be described below with reference to FIGS. 1 through 6.

Figure 2:
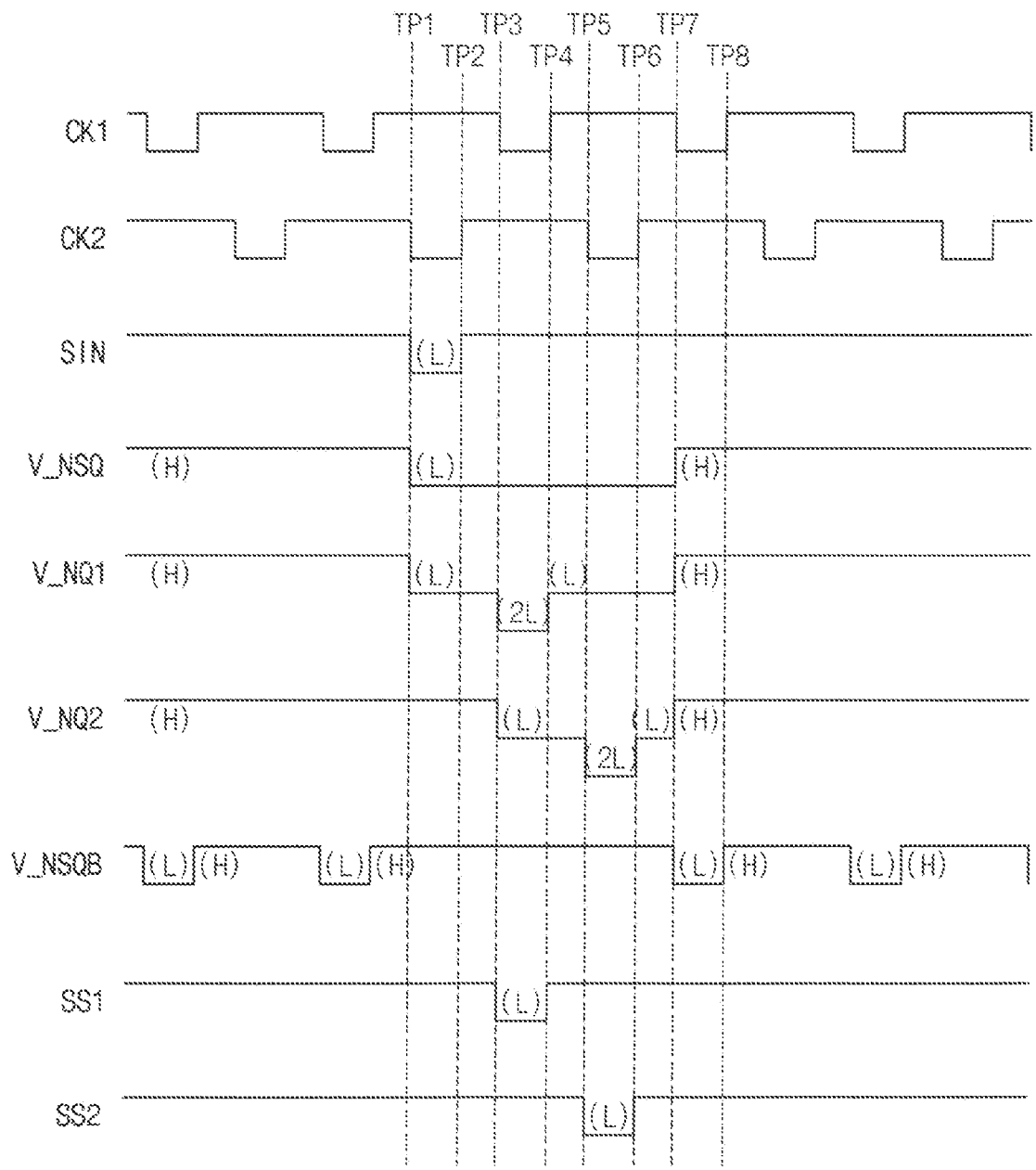
FIG. 2 is a timing diagram for describing an example of an operation of a stage of FIG. 1.

FIG. 2 is used for describing an example of an operation of a stage of FIG. 1, and FIGS. 3 through 6 are used for describing an example of an operation of a stage of FIG. 1.

Referring to FIGS. 1 and 2, each stage 100 may receive the input signal SIN, the first clock signal CK1 and the second clock signal CK2. The input signal SIN may be the scan start signal with respect to the first stage of the plurality of stages, and may be the second scan signal SS2 of the previous stage with respect to the remaining stages of the plurality of stages. The first and second clock signals CK1 and CK2 may have difference phases (e.g., opposite phases, but not limited thereto). In an embodiment, with respect to each of the first and second clock signals CK1 and CK2, an on period (e.g., a low period) may be shorter than an off period (e.g., a high period) as illustrated in FIG. 2. For example, a duty cycle of each of the first and second clock signals CK1 and CK2 may be, but not be limited to, from about 20% to about 40%. In other an embodiment, the on period of each of the first and second clock signals CK1 and CK2 may be longer than or equal to the off period of each of the first and second clock signals CK1 and CK2. In FIGS. 1 through 6, an example is illustrated where the transistors T1, T2, T3, T4, T5, T6, T7, T8, T9, T10, T11 and T12 are the PMOS transistors, the first on level is a first low level L, the second on level is a second low level 2L, the off level is a high level H, the gate-on voltage is a low gate voltage VGL, and the gate-off voltage is a high gate voltage VGH.

Figure 3:
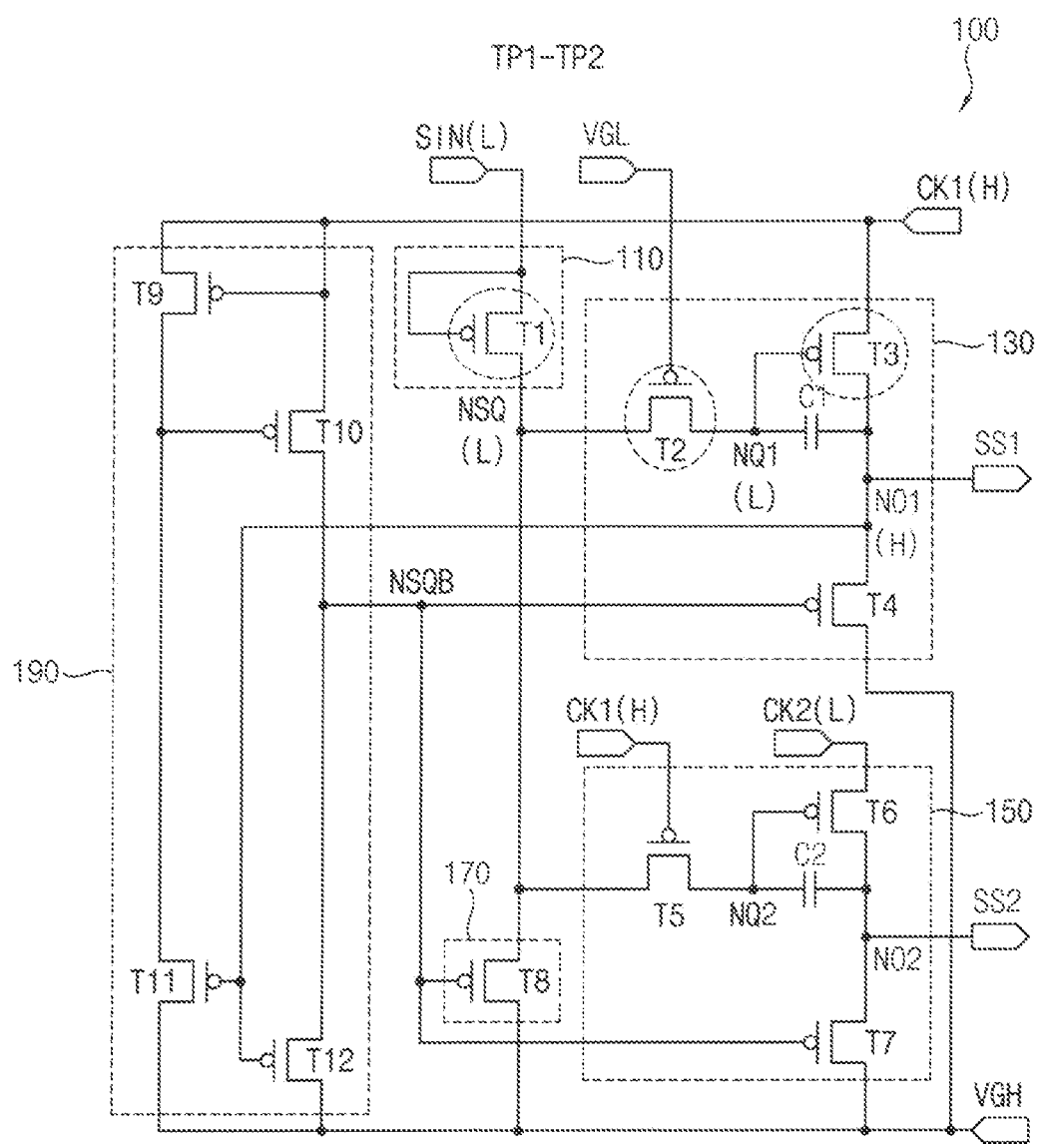
FIGS. 3 through 6 are circuit diagrams each for describing a respective example of an operation of a stage of FIG. 1.

As illustrated in FIGS. 2 and 3, in a period from a first time point TP1 to a second time point TP2, the input signal SIN having the first low level L may be applied, the first clock signal CK1 may have the high level H, and the second clock signal CK2 may have the first low level L. The diode-connected first transistor T1 may transfer the input signal SIN having the first low level L to the shared control node NSQ, and the voltage V_NSQ of the shared control node NSQ may be changed to the first low level L. The second transistor T2 may be turned on in response to the low gate voltage VGL, the turned-on second transistor T2 may transfer the voltage V_NSQ of the shared control node NSQ having the first low level L to the first control node NQ1, and the voltage V_NQ1 of the first control node NQ1 may be changed to the first low level L. The third transistor T3 may be turned on in response to the voltage V_NQ1 of the first control node NQ1 having the first low level L, the turned-on third transistor T3 may transfer the first clock signal CK1 having the high level H to the first output node NO1, the voltage V_NQ1 of the first control node NQ1, or a voltage of the first electrode of the first capacitor C1 may have the first low level L, and a voltage of the first output node NO1, or a voltage of the second electrode of the first capacitor C1 may have the high level H.

Figure 4:
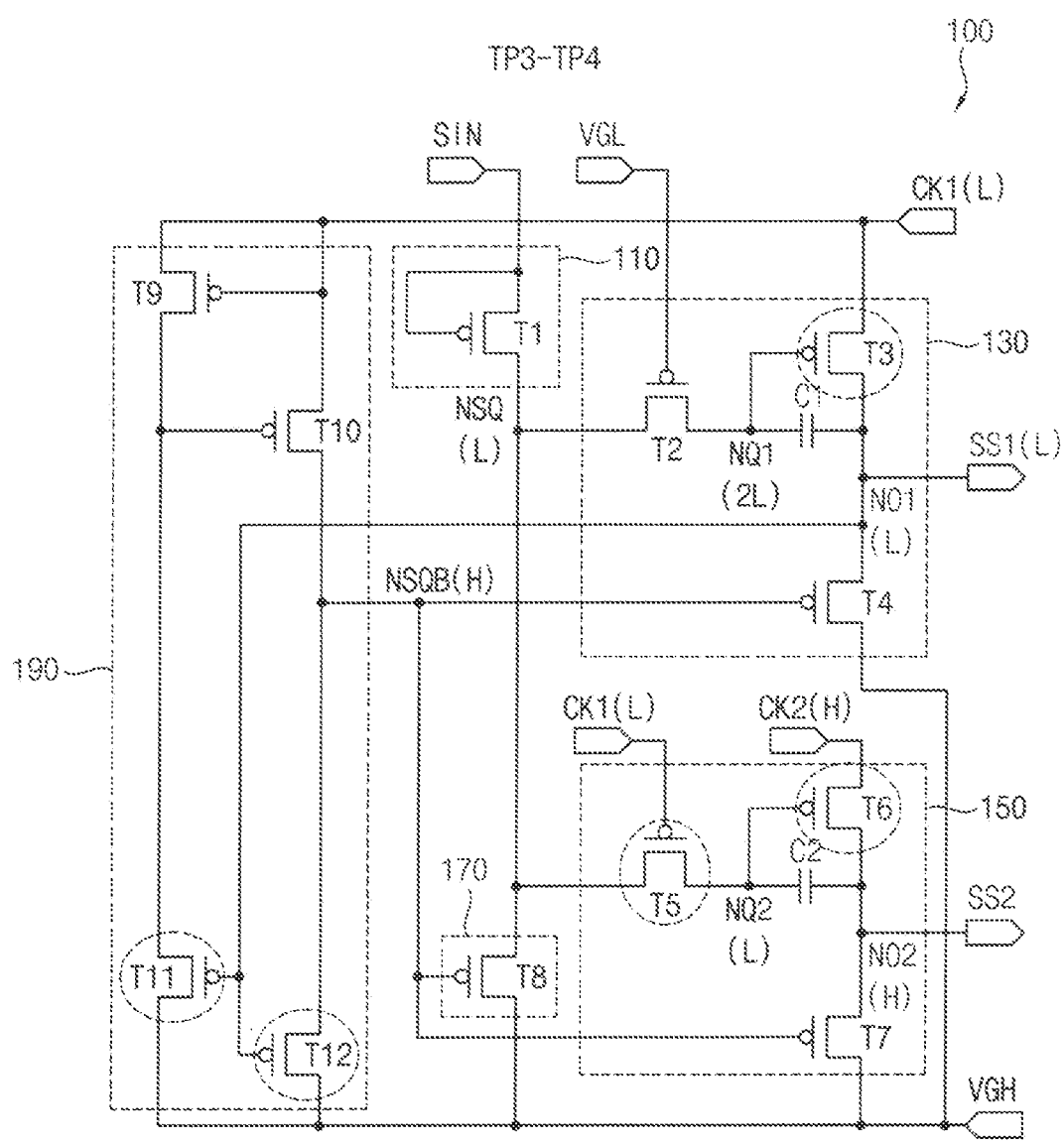

As illustrated in FIGS. 2 and 4, in a period from a third time point TP3 to a fourth time point TP4, the first clock signal CK1 may have the first low level L, and the second clock signal CK2 may have the high level H. If the first clock signal CK1 having the first low level L is applied to the first output node NO1 through the turned-on third transistor T3, the voltage of the first output node NO1, or the voltage of the second electrode of the first capacitor C1 may be changed from the high level H to the first low level L. If the voltage of the second electrode of the first capacitor C1 is changed from the high level H to the first low level L, the voltage of the first electrode of the first capacitor C1, or the voltage V_NQ1 of the first control node NQ1 may be changed from the first low level L to the second low level 2L lower than the first low level L. In an embodiment, a voltage level difference between the first low level L and the second low level 2L may correspond to, but not limited to, a voltage level difference between the high level H and the first low level L. In an embodiment, an operation that changes the voltage V_NQ1 of the first control node NQ1 from the first low level L to the second low level 2L may be referred to as a bootstrap operation, and the first capacitor C1 may be referred to as a bootstrap capacitor.

The third transistor T3 may be maintained in a turn-on state based on the voltage V_NQ1 of the first control node NQ1 having the second low level 2L, and the turned-on third transistor T3 may output the first clock signal CK1 having the first low level L as the first scan signal SS1 at the first output node NO1. The twelfth transistor T12 may be turned on in response to the first scan signal SS1 having the first low level L, the turned-on twelfth transistor T12 may transfer the high gate voltage VGH to the shared inverted control node NSQB, and thus the voltage V_NSQB of the shared inverted control node NSQB may be maintained as the high level H. The eleventh transistor T11 also may be turned on in response to the first scan signal SS1 having the first low level L, and the turned-on eleventh transistor T11 may transfer the high gate voltage VGH to the gate of the tenth transistor T10. Thus, although the ninth transistor T9 is turned on in response to the first clock signal CK1 having the first low level L, the tenth transistor T10 may not be turned on by the high gate voltage VGH transferred through the eleventh transistor T11, and the first clock signal CK1 having the first low level L may not be transferred through the tenth transistor T10 to the shared inverted control node NSQB. In an embodiment, to cause the tenth transistor T10 not to be turned on, the eleventh transistor T11 may have a size larger than a size of the ninth transistor T9, but the sizes of the ninth and eleventh transistors T9 and T11 are limited thereto.

The fifth transistor T5 may be turned on in response to the first clock signal CK1 having the first low level L, the turned-on fifth transistor T5 may transfer the voltage V_NSQ of the shared control node NSQ having the first low level L to the second control node NQ2, and the voltage V_NQ2 of the second control node NQ2 may be changed to the first low level L. The sixth transistor T6 may be turned on in response to the voltage V_NQ2 of the second control node NQ2 having the first low level L, the turned-on sixth transistor T6 may transfer the second clock signal CK2 having the high level H to the second output node NO2, the voltage V_NQ2 of the second control node NQ2, or a voltage of the first electrode of the second capacitor C2 may have the first low level L, and a voltage of the second output node NO2, or a voltage of the second electrode of the second capacitor C2 may have the high level H.

At the fourth time point TP4, if the first clock signal CK1 is changed from the first low level L to the high level H, the third transistor T3 may transfer the first clock signal CK1 having the high level H to the first output node NO1, and the first scan signal SS1 at the first output node NO1 may be changed from the first low level L to the high level H. Further, if the voltage of the first output node NO1, or the voltage of the second electrode of the first capacitor C1 is changed the first low level L to the high level H, the voltage of the first electrode of the first capacitor C1, or the voltage V_NQ1 of the first control node NQ1 may be changed from the second low level 2L to the first low level L.

Figure 5:
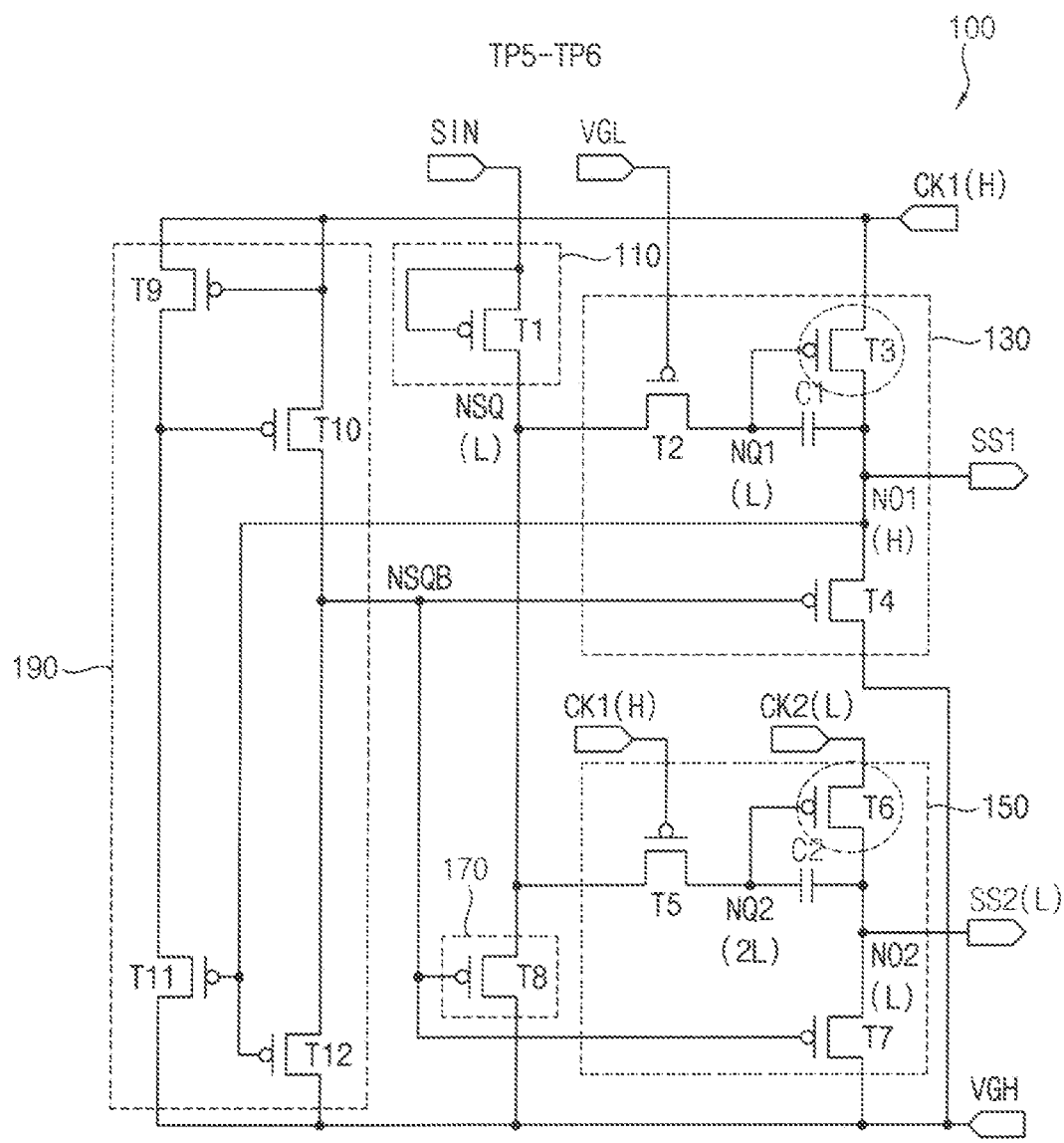

As illustrated in FIGS. 2 and 5, in a period from a fifth time point TP5 to a sixth time point TP6, the first clock signal CK1 may have the high level H, and the second clock signal CK2 may have the first low level L. If the second clock signal CK2 having the first low level L is applied through the turned-on sixth transistor T6 to the second output node NO2, the voltage of the second output node NO2, or the voltage of the second electrode of the second capacitor C2 may be changed from the high level H to the first low level L. If the voltage of the second electrode of the second capacitor C2 is changed from the high level H to the first low level L, the voltage of the first electrode of the second capacitor C2, or the voltage V_NQ2 of the second control node NQ2 may be changed from the first low level L to the second low level 2L lower than the first low level L. In an embodiment, like the first capacitor C1, the second capacitor C2 also be referred to as a bootstrap capacitor. The sixth transistor T6 may be maintained in a turn-on state based on the voltage V_NQ2 of the second control node NQ2 having the second low level 2L, and the turned-on sixth transistor T6 may output the second clock signal CK2 having the first low level L as the second scan signal SS2 at the second output node NO2.

At the sixth time point TP6, if the second clock signal CK2 is changed from the first low level L to the high level H, the sixth transistor T6 may transfer the second clock signal CK2 having the high level H to the second output node NO2, and the second scan signal SS2 at the second output node NO2 may be changed from the first low level L to the high level H. Further, if the voltage of the second output node NO2, or the voltage of the second electrode of the second capacitor C2 is changed the first low level L to the high level H, the voltage of the first electrode of the second capacitor C2, or the voltage V_NQ2 of the second control node NQ2 may be changed from the second low level 2L to the first low level L.

Figure 6:
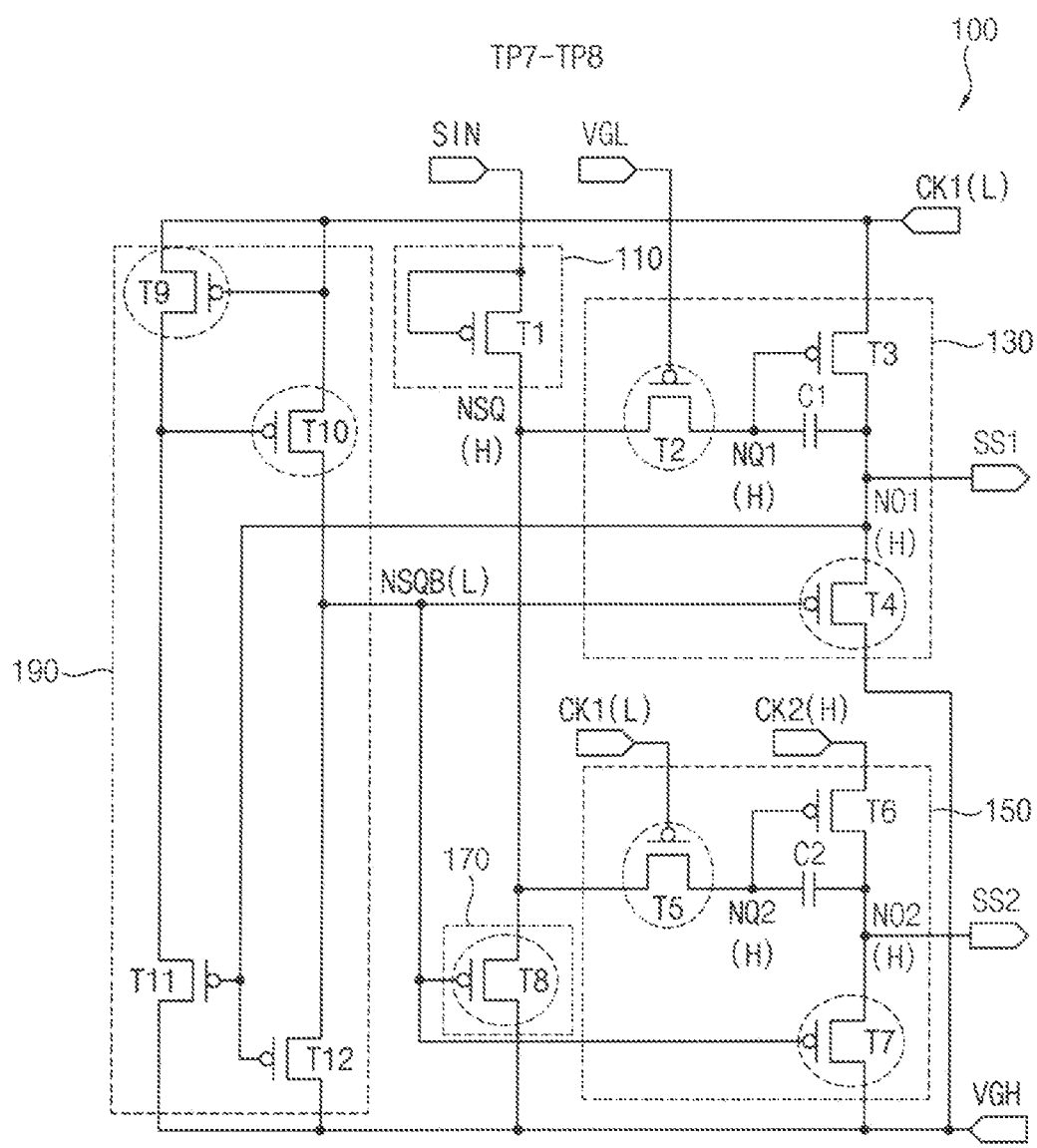

As illustrated in FIGS. 2 and 6, in a period from a seventh time point TP7 to an eighth time point TP8, the first clock signal CK1 may have the first low level L, and the second clock signal CK2 may have the high level H. The ninth transistor T9 may be turned on in response to the first clock signal CK1 having the first low level L, and the turned-on ninth transistor T9 may transfer the first clock signal CK1 having the first low level L to the gate of the tenth transistor T10. The tenth transistor T10 may be turned on in response to the first clock signal CK1 having the first low level L transferred through the ninth transistor T9, the turned-on tenth transistor T10 may transfer the first clock signal CK1 having the first low level L to the shared inverted control node NSQB, and the voltage V_NSQB of the shared inverted control node NSQB may be changed to the first low level L. The eighth transistor T8 may be turned on in response to the voltage V_NSQB of the shared inverted control node NSQB having the first low level L, the turned-on eighth transistor T8 may transfer the high gate voltage VGH to the shared control node NSQ, and the voltage V_NSQ of the shared control node NSQ may be changed to the high level H. The second transistor T2 may be turned on in response to the low gate voltage VGL, the turned-on second transistor T2 may transfer the voltage V_NSQ of the shared control node NSQ having the high level H to the first control node NQ1, and the voltage V_NQ1 of the first control node NQ1 may be changed to the high level H. The fifth transistor T5 may be turned on in response to the first clock signal CK1 having the first low level L, the turned-on fifth transistor T5 may transfer the voltage V_NSQ of the shared control node NSQ having the high level H to the second control node NQ2, and the voltage V_NQ2 of the second control node NQ2 may be changed to the high level H. The fourth and seventh transistors T4 and T7 may be turned on in response to the voltage V_NSQB of the shared inverted control node NSQB having the first low level L, the turned-on fourth transistor T4 may transfer the high gate voltage VGH to the first output node NO1, and the turned-on seventh transistor T7 may transfer the high gate voltage VGH to the second output node NO2. In an embodiment, before the first time point TP1 and/or after the eighth time point TP8, the voltage V_NSQB of the shared inverted control node NSQB may periodically have the first low level L each time the first clock signal CK1 has the first low level L, and the high gate voltage VGH may be periodically transferred by the fourth, seventh and eighth transistors T4, T7 and T8 to the first output node NO1, the second output node NO2 and the shared control node NSQ each time the voltage V_NSQB of the shared inverted control node NSQB has the first low level L.

Figure 7:
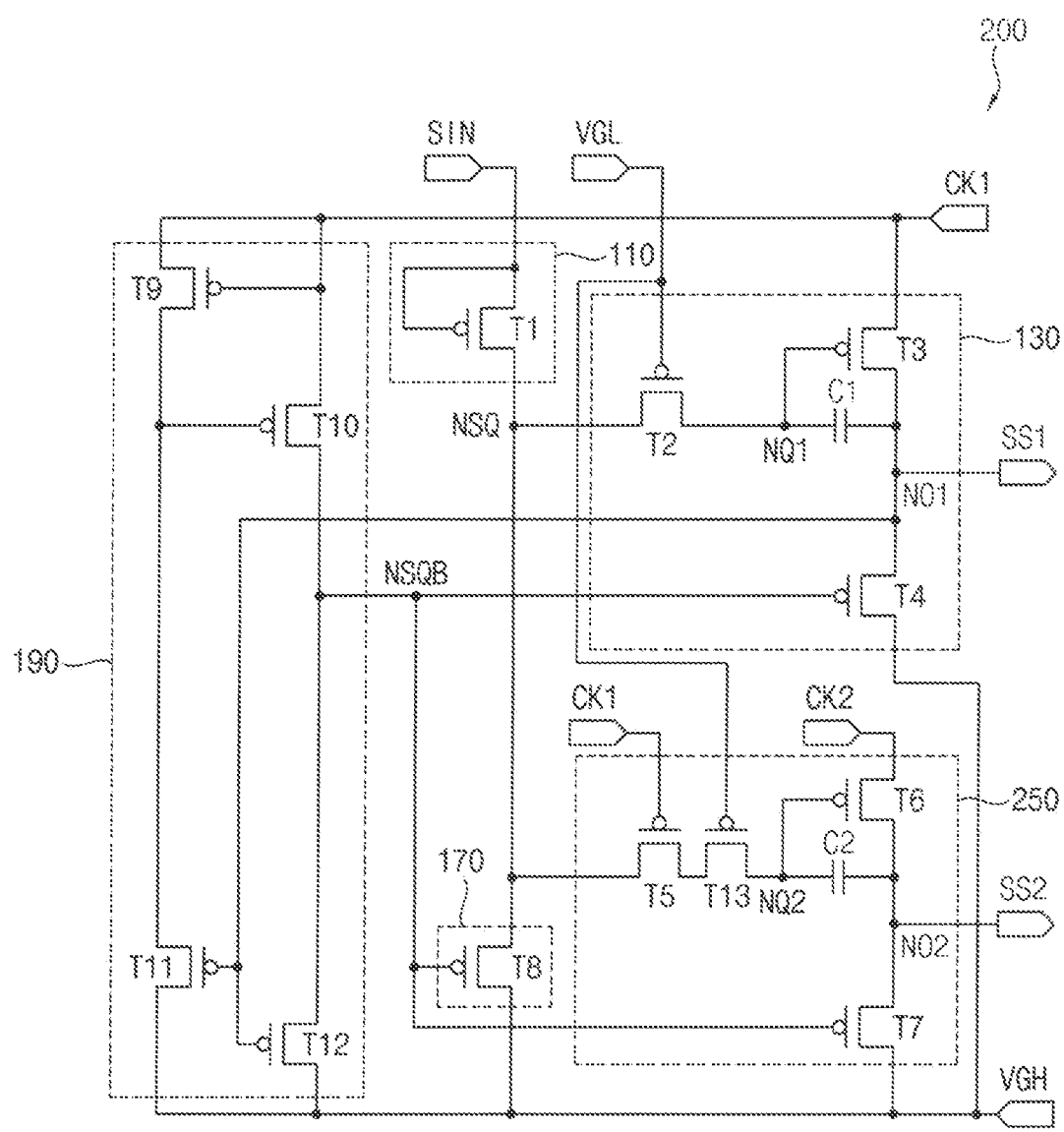
FIG. 7 is a circuit diagram illustrating each stage included in a scan driver according to an embodiment.

FIG. 7 illustrates each stage included in a scan driver according to an embodiment.

Referring to FIG. 7, each stage 200 of a scan driver according to an embodiment may include a shared input circuit 110, a first output circuit 130, a second output circuit 250, a shared stabilizer circuit 170 and a shared inverter circuit 190. The stage 200 of FIG. 7 may have a configuration and an operation similar to those of a stage 100 of FIG. 1, except that the second output circuit 250 may further include a thirteenth transistor T13 coupled between a second terminal of a fifth transistor T5 and a second control node NQ2.

The thirteenth transistor T13 may include a gate receiving a gate-on voltage VGL, a first terminal coupled to the second terminal of the fifth transistor T5, and a second terminal coupled to the second control node NQ2. In a first case where the second output circuit 250 does not include the thirteenth transistor T13, as illustrated in FIG. 5, while the second control node NQ2 is bootstrapped, a voltage of the second control node NQ2 having a second low level 2L may be applied to the second terminal of the fifth transistor T5, and a first clock signal CK1 having a high level H may be applied to a gate of the fifth transistor T5. Thus, in this case, a high gate stress may be applied to the fifth transistor T5. However, in a second case where the second output circuit 250 includes the thirteenth transistor T13, although the voltage of the second control node NQ2 having the second low level 2L is applied to the second terminal of the thirteenth transistor T13, the gate-on voltage VGL having a first low level L may be applied to the gate of the thirteenth transistor T13, and thus a gate stress to the thirteenth transistor T13 may be reduced compared with the high gate stress to the fifth transistor T5 in the first case. Further, since the voltage of the second control node NQ2 having the second low level 2L is not transferred to the second terminal of the fifth transistor T5 by the thirteenth transistor T13, a gate stress to the fifth transistor T5 also may be reduced compared with the high gate stress in the first case.

Figure 8:
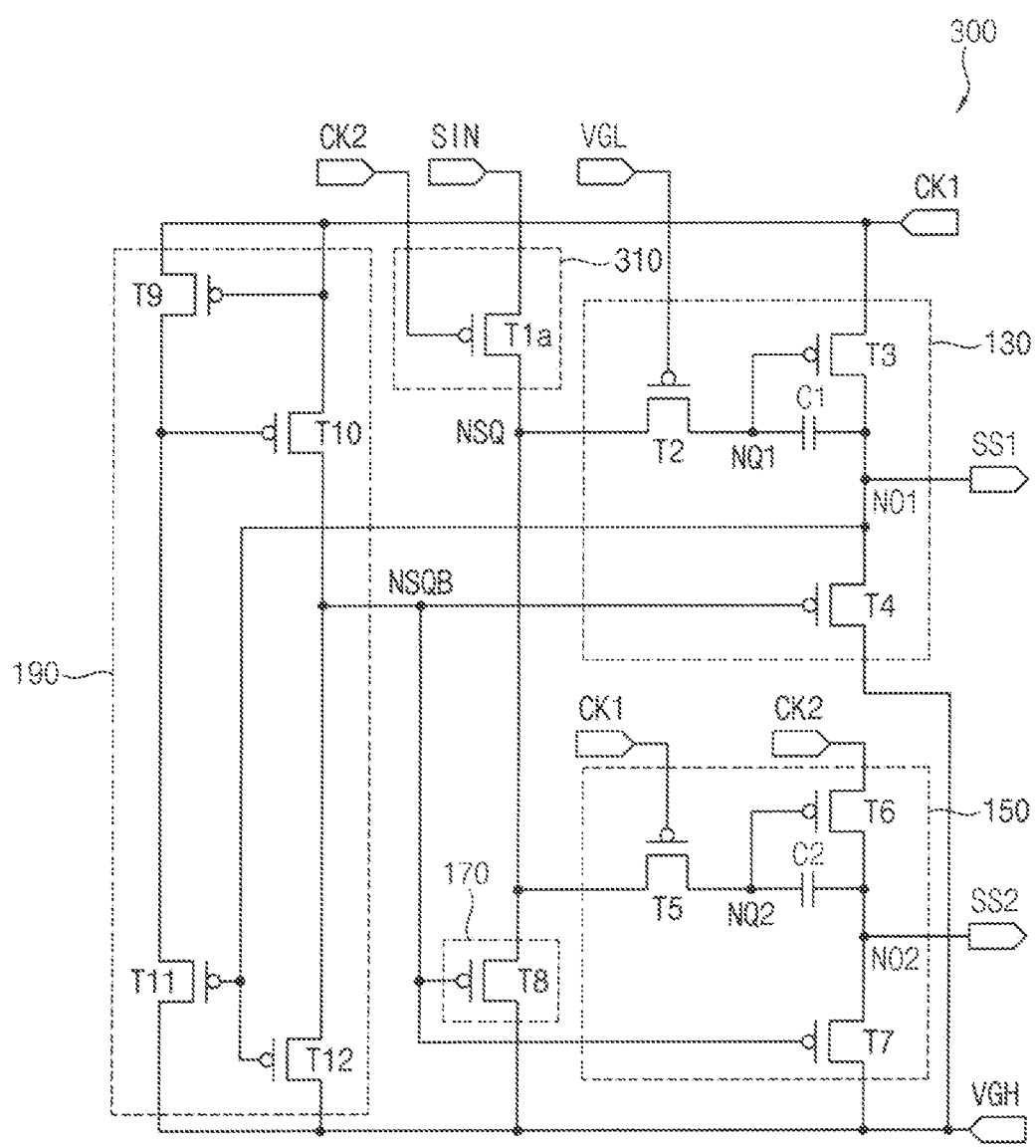
FIG. 8 is a circuit diagram illustrating each stage included in a scan driver according to an embodiment.
Figure 9:
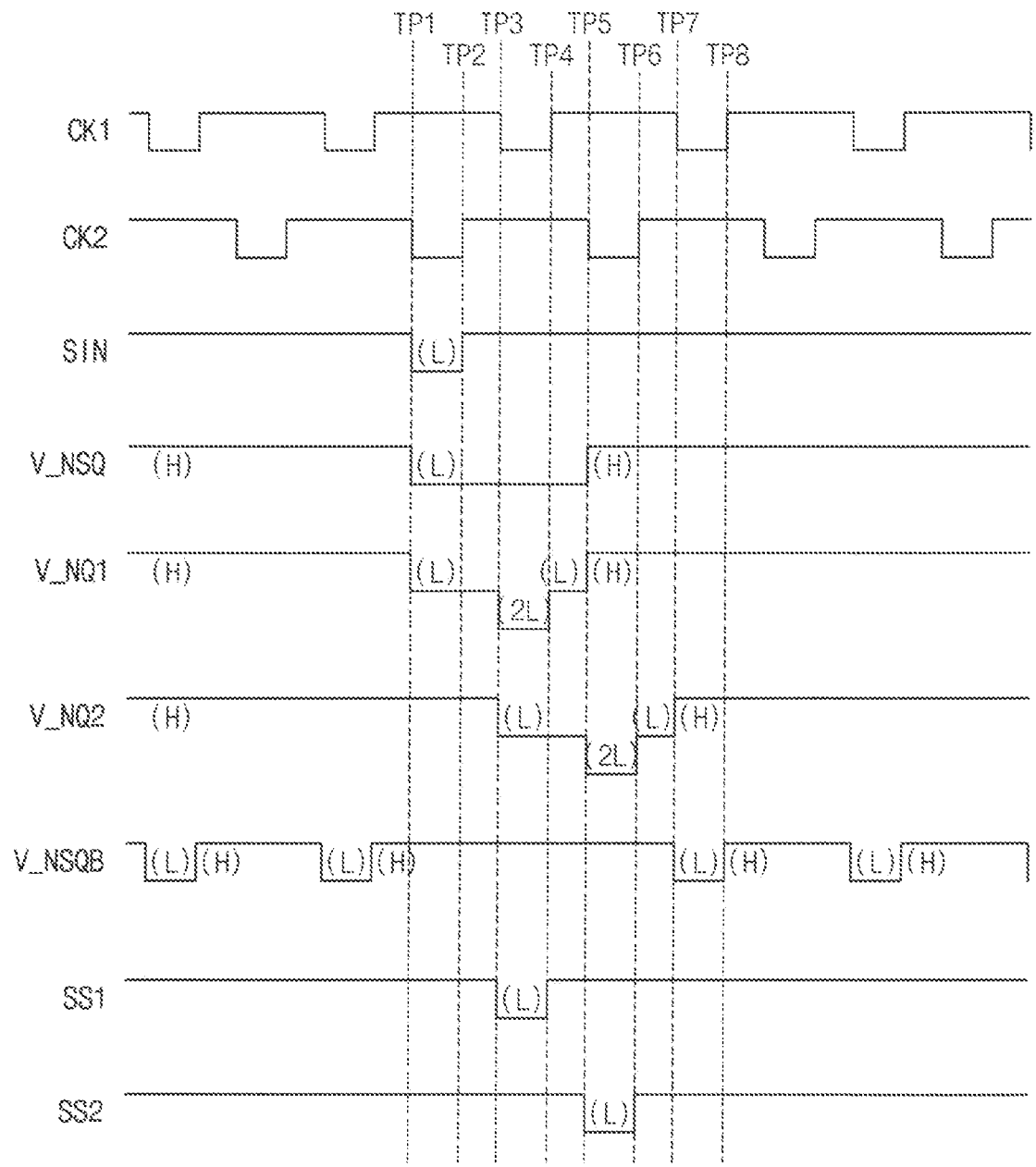
FIG. 9 is a timing diagram for describing an example of an operation of a stage of FIG. 8.

FIG. 8 illustrates each stage included in a scan driver according to an embodiment, and FIG. 9 is used for describing an example of an operation of a stage of FIG. 8.

Referring to FIG. 8, each stage 300 of a scan driver according to an embodiment may include a shared input circuit 310, a first output circuit 130, a second output circuit 150, a shared stabilizer circuit 170 and a shared inverter circuit 190. The stage 300 of FIG. 8 may have a configuration similar to that of a stage 100 of FIG. 1, except that a first transistor T1a of the shared input circuit 310 may receive a second clock signal CK2 instead of an input signal SIN. Further, as illustrated in FIG. 9, the stage 300 of FIG. 8 may have an operation similar to that of the stage 100 of FIG. 1, except that a voltage V_NSQ of a shared control node NSQ and a voltage V_NQ1 of a first control node NQ1 may be changed to a high level H at a fifth time point TP5 in which a second clock signal CK2 is changed to a first low level L.

The shared input circuit 310 may include the first transistor T1a including a gate receiving the second clock signal CK2, a first terminal receiving the input signal SIN, and a second terminal coupled to the shared control node NSQ. As illustrated in FIG. 9, in a period from a first time point TP1 to a second time point TP2, the second clock signal CK2 may have the first low level L, the first transistor T1a may transfer the input signal SIN having the first low level L to the shared control node NSQ in response to the second clock signal CK2 having the first low level L, and the voltage V_NSQ of the shared control node NSQ may be changed to the first low level L. Further, at a fifth time point TP5 in which the second clock signal CK2 is changed to the first low level L, the first transistor T1a may transfer the input signal SIN having the high level H to the shared control node NSQ in response to the second clock signal CK2 having the first low level L, and the voltage V_NSQ of the shared control node NSQ may be changed to the high level H. A second transistor T2 may be turned on in response to a low gate voltage VGL, the turned-on second transistor T2 may transfer the voltage V_NSQ of the shared control node NSQ having the high level H to the first control node NQ1, and the voltage V_NQ1 of the first control node NQ1 may be changed to the high level H. The fifth transistor T5 may be turned off in response to the first clock signal CK1 having the high level H, and the voltage V_NSQ of the shared control node NSQ having the high level H may not be transferred to the second control node NQ2 by the turned-off fifth transistor T5.

Figure 10:
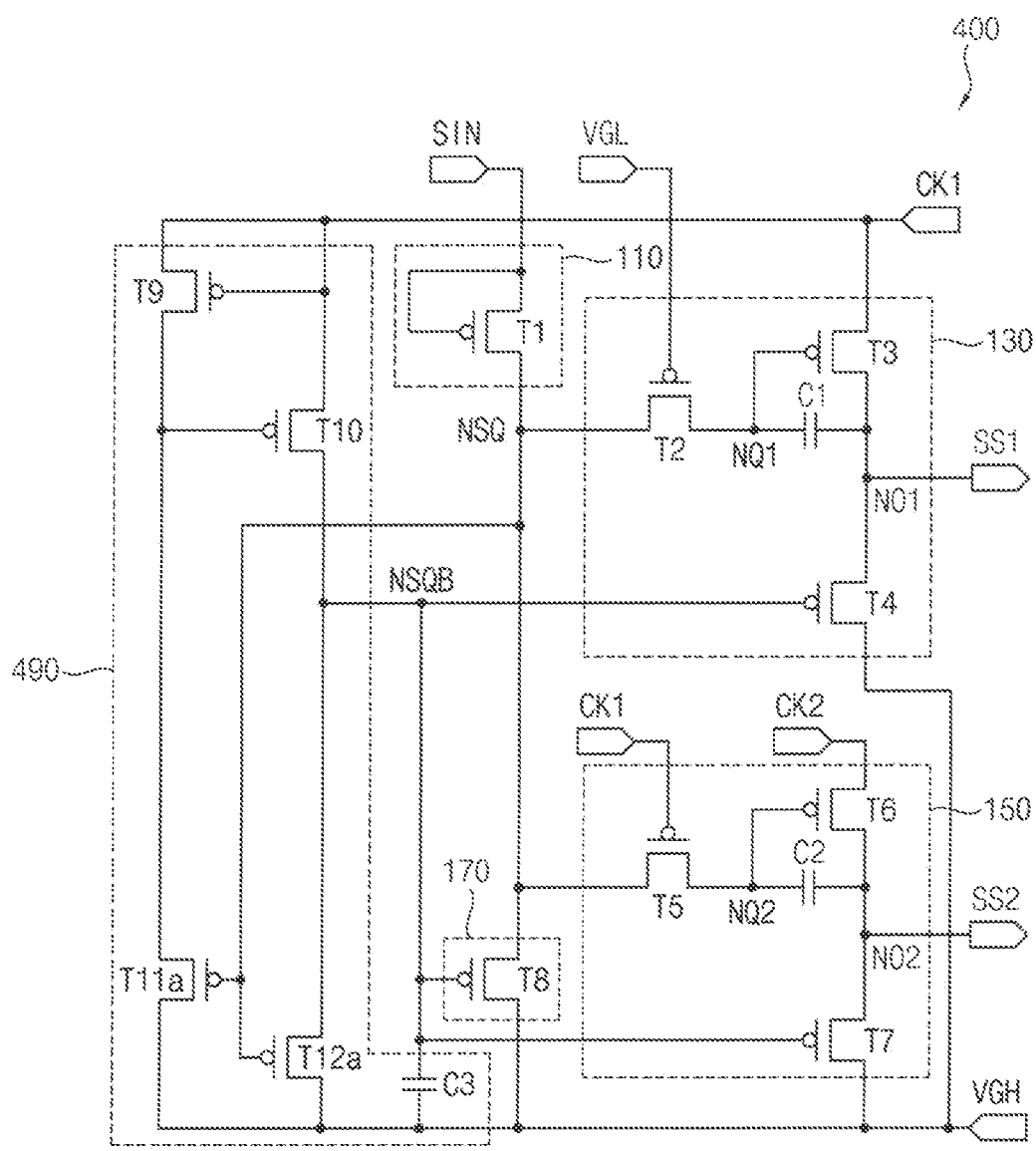
FIG. 10 is a circuit diagram illustrating each stage included in a scan driver according to an embodiment.
Figure 11:
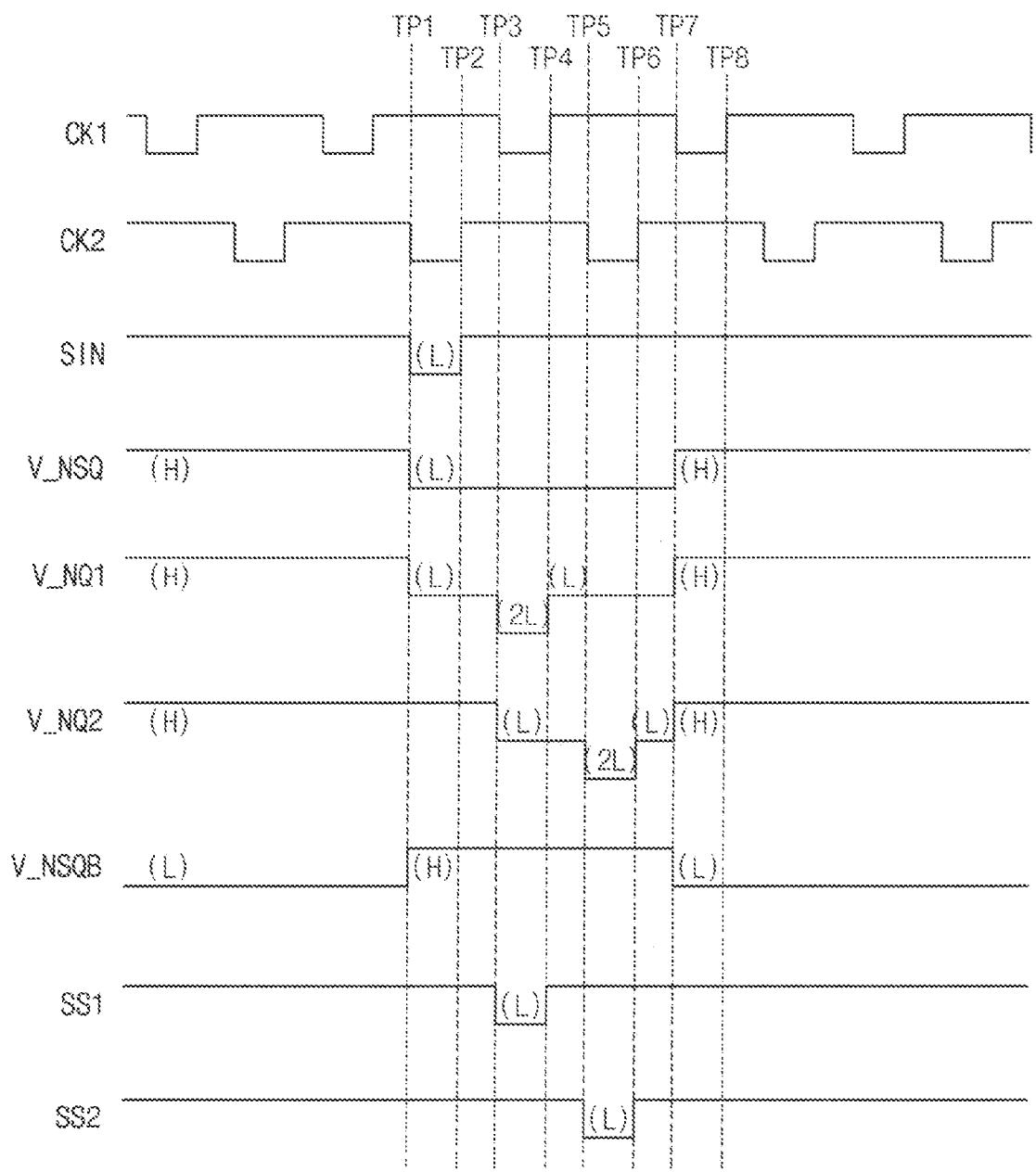
FIG. 11 is a timing diagram for describing an example of an operation of a stage of FIG. 10.

FIG. 10 illustrates each stage included in a scan driver according to an embodiment, and FIG. 11 is used for describing an example of an operation of a stage of FIG. 10.

Referring to FIG. 10, each stage 400 of a scan driver according to an embodiment may include a shared input circuit 110, a first output circuit 130, a second output circuit 150, a shared stabilizer circuit 170 and a shared inverter circuit 490. The stage 400 of FIG. 10 may have a configuration similar to that of a stage 100 of FIG. 1, except that gates of eleventh and twelfth transistor T11a and T12a of the shared inverter circuit 490 may be coupled to a shared control node NSQ instead of a first output node NO1, and the shared inverter circuit 490 may further include a third capacitor C3. Further, as illustrated in FIG. 11, the stage 400 of FIG. 10 may have an operation similar to that of the stage 100 of FIG. 1, except that a voltage V_NSQB of a shared inverted control node NSQB may be maintained as a first low level L in a period before a first time point TP1 and in a period after a seventh period TP7.

The shared inverter circuit 490 may control the shared inverted control node NSQB in response to a first clock signal CK1 and a voltage V_NSQ of the shared control node NSQ. In an embodiment, as illustrated in FIG. 10, the shared inverter circuit 490 may include a ninth transistor including a gate receiving the first clock signal CK1, a first terminal receiving the first clock signal CK1, and a second terminal, a tenth transistor T10 including a gate coupled to the second terminal of the ninth transistor T9, a first terminal receiving the first clock signal CK1, and a second terminal coupled to the shared inverted control node NSQB, the eleventh transistor T11a including a gate coupled to the shared control node NSQ, a first terminal coupled to the gate of the tenth transistor T10, and a second terminal receiving a gate-off voltage VGH, the twelfth transistor T12a including a gate coupled to the shared control node NSQ, a first terminal coupled to the shared inverted control node NSQB, and a second terminal receiving the gate-off voltage VGH, and the third capacitor C3 including a first electrode coupled to the shared inverted control node NSQB, and a second electrode receiving the gate-off voltage VGH. For example, as illustrated in FIG. 11, the shared inverter circuit 490 may periodically apply the first clock signal CK1 having the first low level L to the shared inverted control node NSQB in the period before the first time point TP1 and in the period after the seventh period TP7, and may maintain the voltage V_NSQB of the shared inverted control node NSQB as the first low level L by using the third capacitor C3. In a period from the first time point TP1 to the seventh period TP7, the shared inverter circuit 490 may transfer the gate-off voltage VGH to the shared inverted control node NSQB in response to the voltage V_NSQ of the shared control node NSQ, and may maintain the voltage V_NSQB of the shared inverted control node NSQB as a high level H.

Although FIG. 1 illustrates an example of a stage 100 including a shared input circuit 110, a first output circuit 130, a second output circuit 150, a shared stabilizer circuit 170 and a shared inverter circuit 190, FIG. 7 illustrates an example of a stage 200 including a second output circuit 250 instead of the second output circuit 150 of FIG. 1, FIG. 8 illustrates an example of a stage 300 including a shared input circuit 310 instead of the shared input circuit 110 of FIG. 1, and FIG. 10 illustrates an example of a stage 400 including a shared inverter circuit 490 instead of the shared inverter circuit 190 of FIG. 1; according to an embodiment, each stage may include two or more of the second output circuit 250 of FIG. 7, the shared input circuit 310 of FIG. 8 and the shared inverter circuit 490 of FIG. 10 instead of two or more of the shared input circuit 110, the a second output circuit 150 and the shared inverter circuit 190 of FIG. 1.

Figure 13:
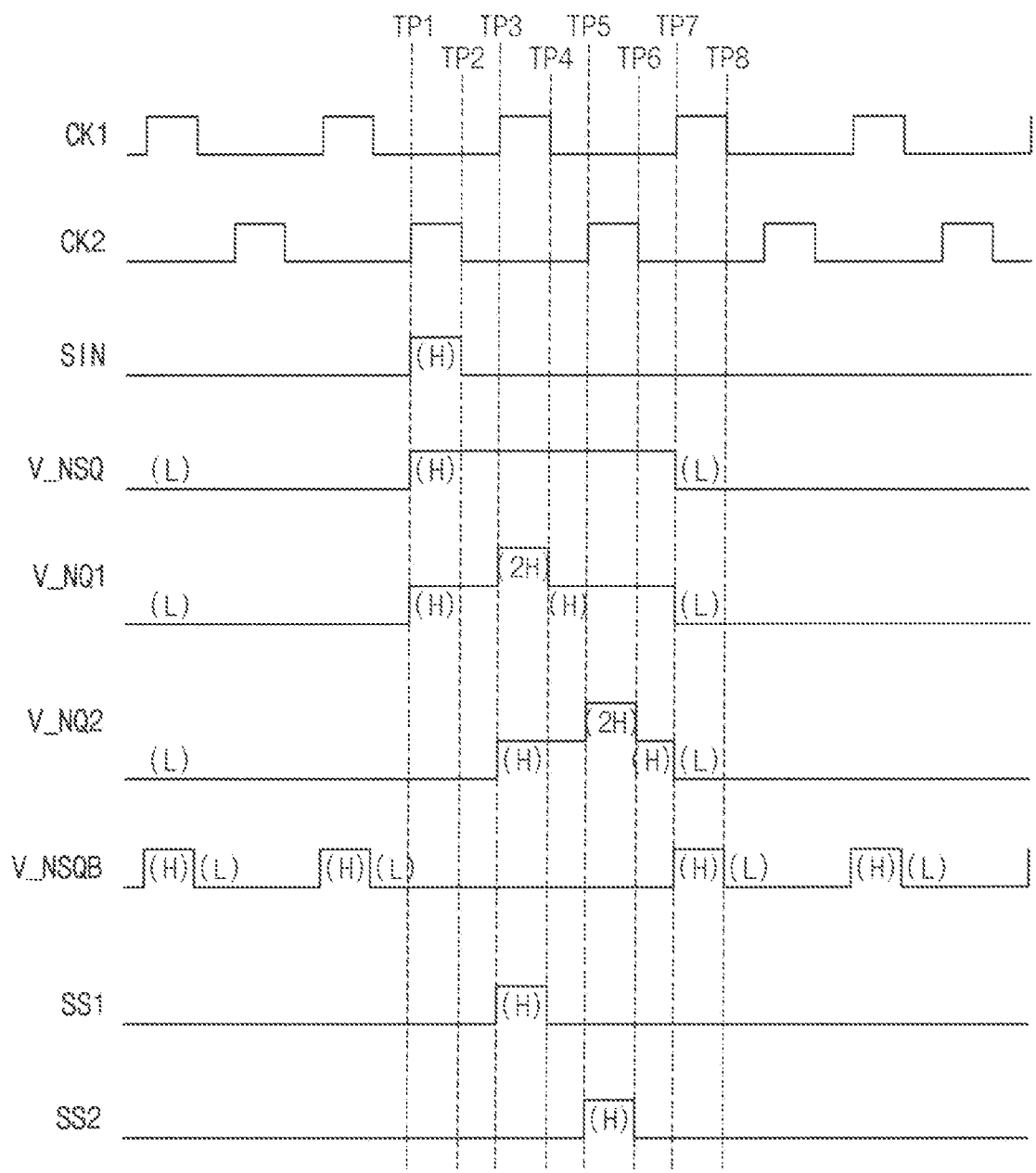
FIG. 13 is a timing diagram for describing an example of an operation of a stage of FIG. 12.

FIG. 12 illustrates each stage included in a scan driver according to an embodiment, and FIG. 13 is used for describing an example of an operation of a stage of FIG. 12.

Referring to FIG. 12, each stage 500 of a scan driver according to an embodiment may include a shared input circuit 510, a first output circuit 530, a second output circuit 550, a shared stabilizer circuit 570 and a shared inverter circuit 590. The stage 500 of FIG. 12 may have a configuration similar to that of a stage 100 of FIG. 1, except that transistors T1', T2', T3', T4', T5', T6', T7', T8', T9', T10', T11' and T12' included in the scan driver or each stage 500 may be implemented with NMOS transistors instead of PMOS transistors, that a gate-on voltage may be a high gate voltage VGH and that a gate-off voltage may be a gate low voltage VGL. Further, as illustrated in FIG. 13, the stage 500 of FIG. 12 may have an operation similar to that of the stage 100 of FIG. 1, except that a first on level may be a first high level H instead of a first low level L of FIG. 2, a second on level may be a second high level 2H instead of a second low level 2L of FIG. 2, and an off level may be a low level L instead of a high level H.

In an alternate embodiment, the transistors of one of the first output circuit or the second output circuit may be NMOS transistors, and the transistors of the other of the first output circuit or the second output circuit may be PMOS transistors. In an alternate embodiment, the transistors of at least one of the shared input circuit, the shared stabilizer circuit and/or the shared inverter circuit may be NMOS transistors, and the transistors of at least another of the shared input circuit, the shared stabilizer circuit and/or the shared inverter circuit may be PMOS transistors.

FIG. 14 illustrates each stage included in a scan driver according to an embodiment.

Referring to FIG. 14, each stage 600 of a scan driver according to an embodiment may include a shared input circuit 510, a first output circuit 530, a second output circuit 650, a shared stabilizer circuit 570 and a shared inverter circuit 590. The stage 600 of FIG. 14 may have a configuration and an operation similar to those of a stage 200 of FIG. 7, except that transistors T1', T2', T3', T4', T5', T6', T7', T8', T9', T10', T11', T12' and T13' included in the scan driver or each stage 600 may be implemented with NMOS transistors instead of PMOS transistors, that a gate-on voltage may be a high gate voltage VGH and that a gate-off voltage may be a gate low voltage VGL.

FIG. 15 illustrates each stage included in a scan driver according to an embodiment.

Referring to FIG. 15, each stage 700 of a scan driver according to an embodiment may include a shared input circuit 710, a first output circuit 530, a second output circuit 550, a shared stabilizer circuit 570 and a shared inverter circuit 590. The stage 700 of FIG. 15 may have a configuration and an operation similar to those of a stage 300 of FIG. 8, except that transistors T1a', T2', T3', T4', T5', T6', T7', T8', T9', T10', T11' and T12' included in the scan driver or each stage 700 may be implemented with NMOS transistors instead of PMOS transistors, that a gate-on voltage may be a high gate voltage VGH and that a gate-off voltage may be a gate low voltage VGL.

Figure 16:
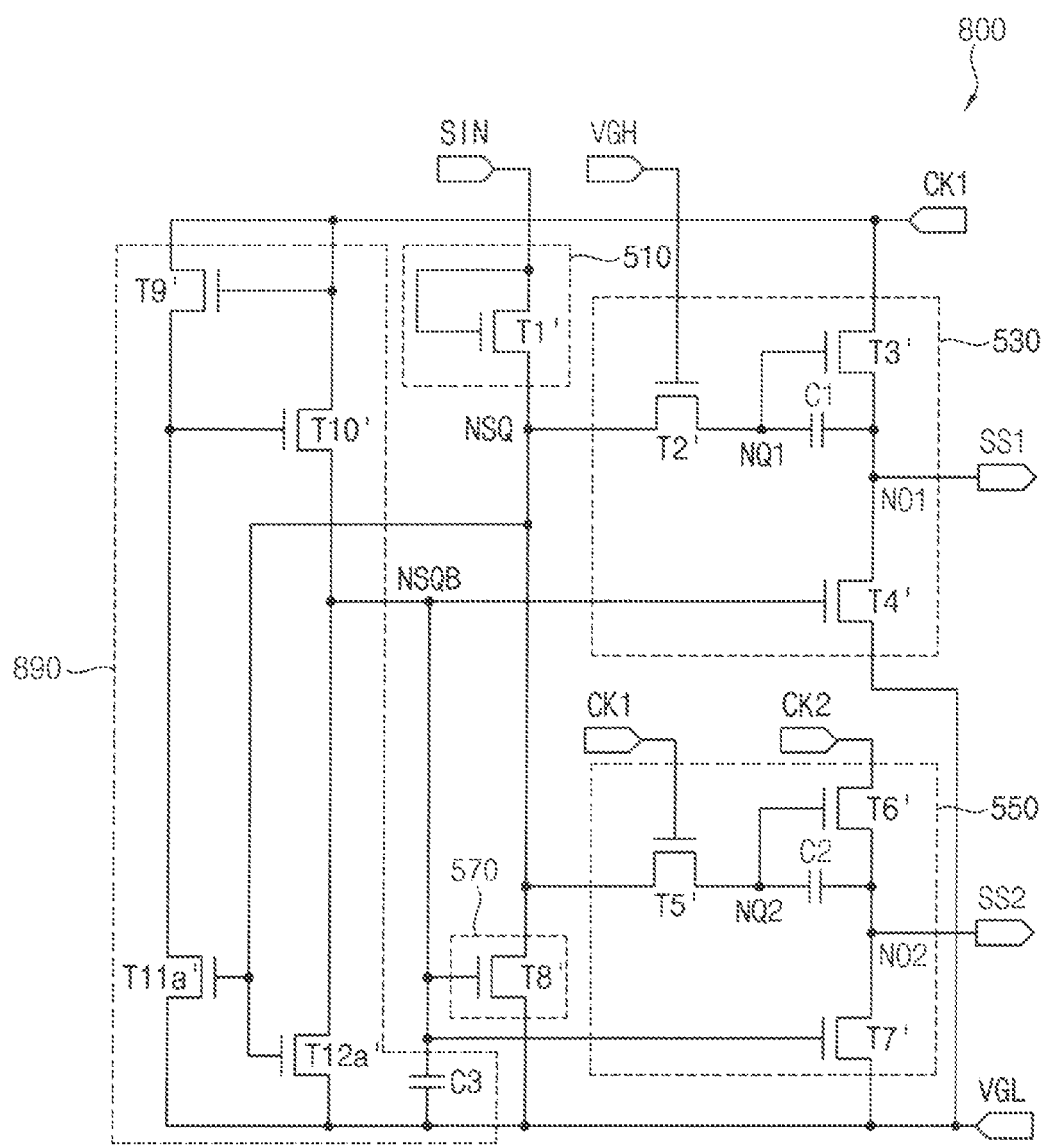
FIG. 16 is a circuit diagram illustrating each stage included in a scan driver according to an embodiment.

FIG. 16 illustrates each stage included in a scan driver according to an embodiment.

Referring to FIG. 16, each stage 800 of a scan driver according to an embodiment may include a shared input circuit 510, a first output circuit 530, a second output circuit 550, a shared stabilizer circuit 570 and a shared inverter circuit 890. The stage 800 of FIG. 16 may have a configuration and an operation similar to those of a stage 400 of FIG. 10, except that transistors T1', T2', T3', T4', T5', T6', T7', T8', T9', T10', T11a' and T12a' included in the scan driver or each stage 800 may be implemented with NMOS transistors instead of PMOS transistors, that a gate-on voltage may be a high gate voltage VGH and that a gate-off voltage may be a gate low voltage VGL.

Figure 17:
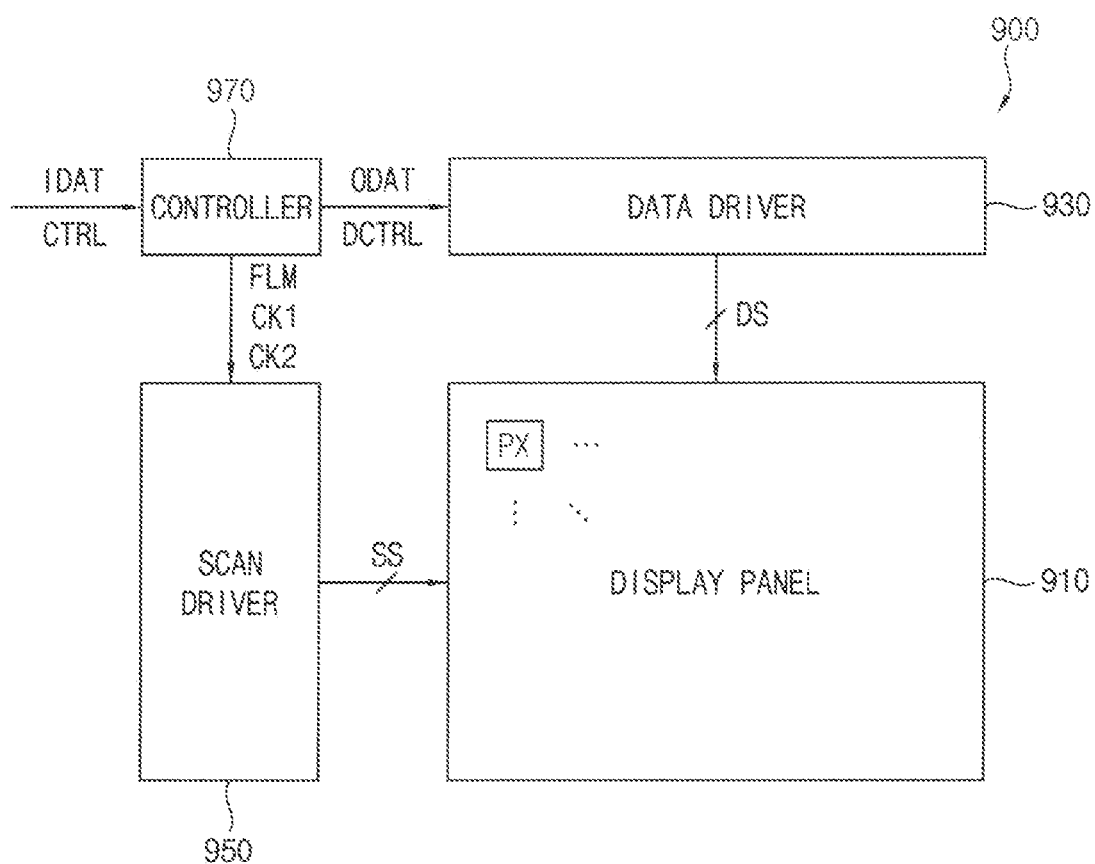
FIG. 17 is a block diagram illustrating a display device including a scan driver according to an embodiment.
Figure 18:
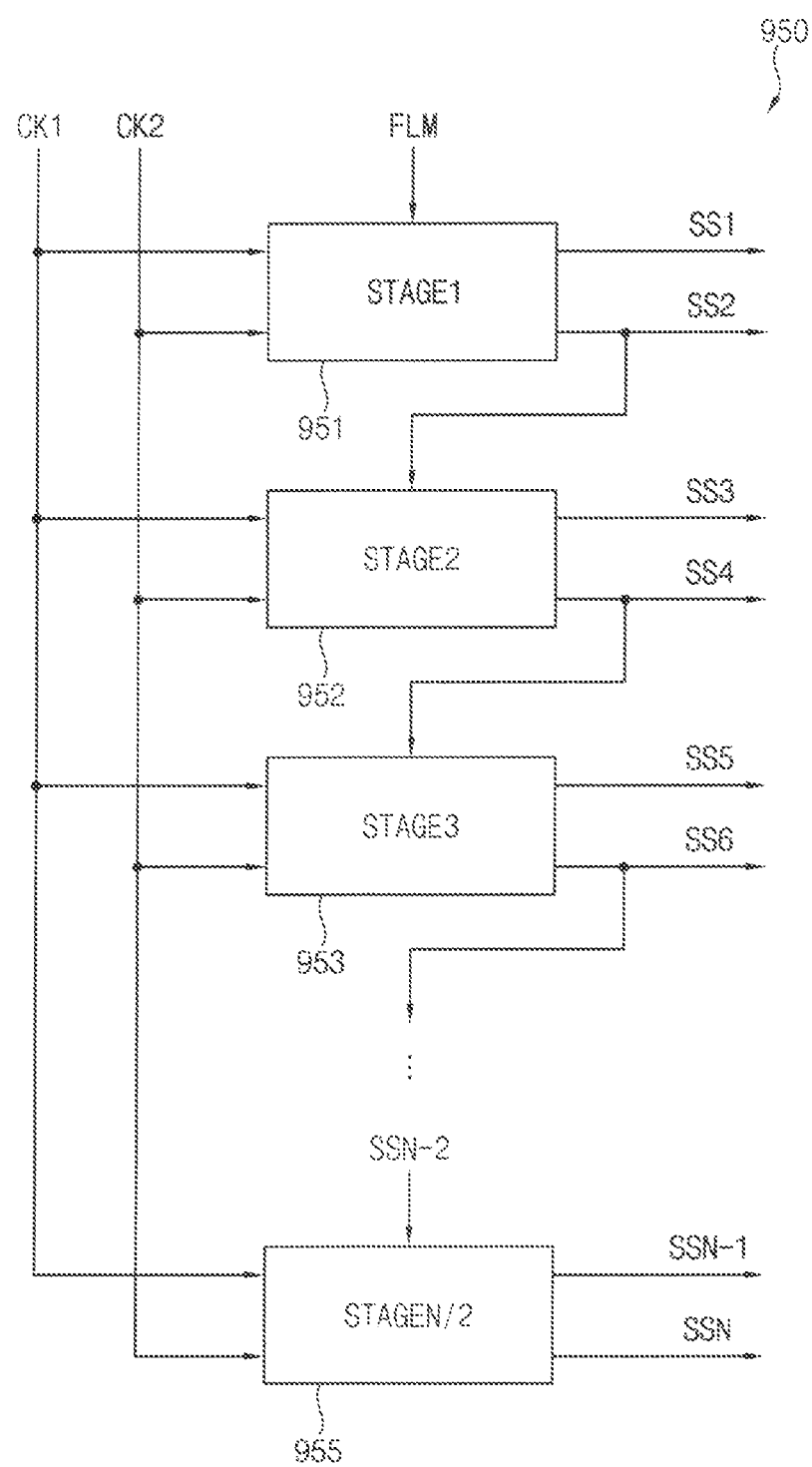
FIG. 18 is a block diagram illustrating a scan driver included in a display device according to an embodiment.

FIG. 17 illustrates a display device including a scan driver according to an embodiment, and FIG. 18 illustrates a scan driver included in a display device according to an embodiment.

Referring to FIG. 17, a display device 900 according to an embodiment may include a display panel 910 that includes a plurality of pixels PX, a data driver 930 that provides data signals DS to the plurality of pixels PX, a scan driver 950 that provides scan signals SS to the plurality of pixels PX, and a controller 970 that controls the data driver 930 and the scan driver 950.

The display panel 910 may include data lines, scan lines and the plurality of pixels PX coupled to the data lines and the scan lines. In an embodiment, each pixel PX may include a storage capacitor, a switching transistor that stores the data signal DS in the storage capacitor in response to the scan signal SS, a driving transistor that generates a driving current based on the data signal DS stored in the storage capacitor, and an organic light emitting diode (OLED) that emits light based on the driving current, and the display panel 910 may be an OLED display panel. However, a configuration of each pixel PX according to an embodiment is not limited to a 2T1C structure including the storage capacitor, the switching transistor and the driving transistor. In other an embodiment, the display panel 910 may be a liquid crystal display (LCD) panel, or the like.

The data driver 930 may generate the data signals DS based on output image data ODAT and a data control signal DCTRL received from the controller 970, and may provide the data signals DS to the plurality of pixels PX through the data lines. In an embodiment, the data control signal DCTRL may include, but not limited to, an output data enable signal, a horizontal start signal and a load signal. In an embodiment, the data driver 930 and the controller 970 may be implemented with a single integrated circuit, and the single integrated circuit may be referred to as a timing controller embedded data driver (TED). In other an embodiment, the data driver 930 and the controller 970 may be implemented with separate integrated circuits.

The scan driver 950 may generate the scan signals SS based on a scan control signal received from the controller 970, and may provide the scan signals SS to the plurality of pixels PX through the scan lines. In an embodiment, the scan control signal may include, but not limited to, a scan start signal FLM, a first clock signals CK1 and a second clock signal CK2. In an embodiment, the scan driver 950 may be integrated or formed in a peripheral portion of the display panel 910. In other an embodiment, the scan driver 950 may be implemented with one or more integrated circuits.

As illustrated in FIG. 18, the scan driver 950 may include a plurality of stages 951, 952, 953, . . . , 955 that receives the first and second clock signals CK1 and CK2 having different phases (e.g., opposite phases). For example, in a case where the display panel 910 includes N pixel rows (e.g., N rows of the pixels PX), where N is an integer greater than 1, the scan driver 950 may include N/2 stages 951, 952, 953, . . . , 955, or first through (N/2)-th stages 951, 952, 953, . . . , 955. Each stage 951, 952, 953, . . . , 955 may receive, as an input signal, the scan start signal FLM or a scan signal (e.g., SS2, SS4, SS6, . . . , SSN−2) of a previous stage, may output one scan signal (e.g., SS1, SS3, SS5, . . . , SSN−1) to one pixel row in synchronization with the first clock signal CK1, and may output another scan signal (e.g., SS2, SS4, SS6, . . . , SSN−2) to another pixel row in synchronization with the second clock signal CK2. For example, the first stage 951 may receive the scan start signal FLM, may output a first scan signal SS1 to a first pixel row in synchronization with the first clock signal CK1, and may output a second scan signal SS2 to a second pixel row in synchronization with the second clock signal CK2. The second stage 952 may receive the second scan signal SS2, may output a third scan signal SS3 to a third pixel row in synchronization with the first clock signal CK1, and may output a fourth scan signal SS4 to a fourth pixel row in synchronization with the second clock signal CK2. The third stage 953 may receive the fourth scan signal SS4, may output a fifth scan signal SS5 to a fifth pixel row in synchronization with the first clock signal CK1, and may output a sixth scan signal SS6 to a sixth pixel row in synchronization with the second clock signal CK2. In this manner, the (N/2)-th stage 955 may receive an (N−2)-th scan signal SSN−2, may output an (N−1)-th scan signal SSN−1 to an (N−1)-th pixel row in synchronization with the first clock signal CK1, and may output an N-th scan signal SSN to an N-th pixel row in synchronization with the second clock signal CK2. As described above, each of the plurality of stages 951, 952, 953, . . . , 955 may output two scan signals (e.g., SS1 and SS2) to two pixel rows by using only two clock signals CK1 and CK2, and a size of the scan driver 950 may be reduced compared with a size of a scan driver where each stage outputs one scan signal.

The controller (e.g., a timing controller TCON) 970 may receive input image data IDAT and a control signal CTRL from an external host (e.g., a graphics processing unit GPU or a graphics card). In an embodiment, the control signal CTRL may include, but not limited to, a vertical synchronization signal, a horizontal synchronization signal, an input data enable signal, a master clock signal, or the like. The controller 970 may generate the output image data ODAT, the data control signal DCTRL and the scan control signal based on the input image data IDAT and the control signal CTRL. The controller 970 may control an operation of the data driver 930 by providing the output image data ODAT and the data control signal DCTRL to the data driver 930, and may control an operation of the scan driver 950 by providing the scan control signal to the scan driver 950.

Figure 19:
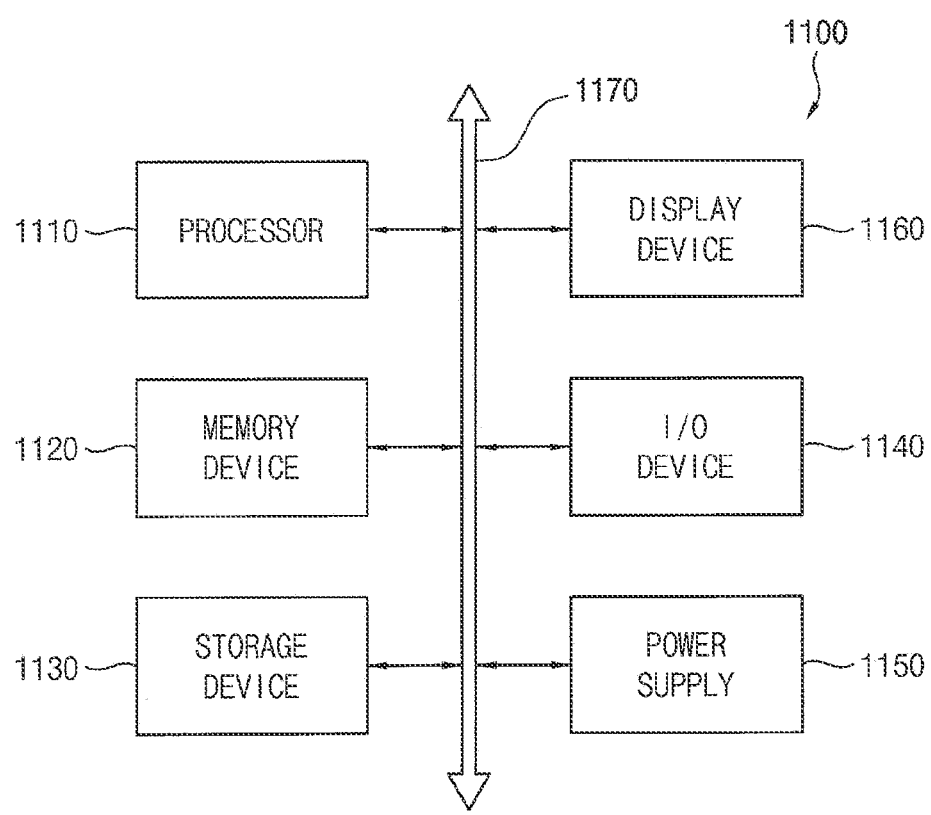
FIG. 19 is a block diagram illustrating an electronic device including a display device according to an embodiment.

FIG. 19 illustrates an electronic device including a display device according to an embodiment.

Referring to FIG. 19, an electronic device 1100 may include a processor 1110, a memory device 1120, a storage device 1130, an input/output (I/O) device 1140, a power supply 1150, a display device 1160, and a communications bus 1170. The electronic device 1100 may further include a plurality of ports for communicating a video card, a sound card, a memory card, a universal serial bus (USB) device, other electric devices, or the like.

The processor 1110 may perform various computing functions or tasks. The processor 1110 may be an application processor (AP), a microprocessor, a central processing unit (CPU), or the like. The processor 1110 may be coupled to other components via the communications bus 1170, which may include an address bus, a control bus, a data bus, or the like. Further, in an embodiment, the processor 1110 may be further coupled to an extended bus such as a peripheral component interconnection (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like, and/or at least one volatile memory device such as a dynamic random access memory (DRAM) device, a static random access memory (SRAM) device, a mobile dynamic random access memory (mobile DRAM) device, or the like.

The storage device 1130 may be a solid-state drive (SSD) device, a hard disk drive (HDD) device, a CD-ROM device, or the like. The I/O device 1140 may be an input device such as a keyboard, a keypad, a mouse, a touch screen, or the like, and an output device such as a printer, a speaker, or the like. The power supply 1150 may supply power for operations of the electronic device 1100. The display device 1160 may be coupled to other components through the buses or other communications links.

In the display device 1160, a scan driver may include a plurality of stages that receives first and second clock signals having different phases, and first and second output circuits of each stage may share a shared control node and a shared inverted control node. The first output circuit of each stage may output a first scan signal in synchronization with the first clock signal, and the second output circuit of each stage may output a second scan signal in synchronization with the second clock signal. Accordingly, each stage of the scan driver may output two scan signals to two pixel rows by using only two clock signals, and a size of the scan driver may be reduced compared with a size of a scan driver where each stage outputs one scan signal.

The inventive concepts may be applied to any display device 1160, and any electronic device 1100 including the display device 1160. For example, the inventive concepts may be applied to a mobile phone, a smart phone, a wearable electronic device, a tablet computer, a television (TV), a digital TV, a 3D TV, a personal computer (PC), a home appliance, a laptop computer, a personal digital assistant (PDA), a portable multimedia player (PMP), a digital camera, a music player, a portable game console, a navigation device, or the like.

The foregoing is illustrative of the inventive concept and is not to be construed as limiting thereof. Although embodiments have been described, those of ordinary skill in the pertinent art will readily appreciate that many modifications are possible in the described and other embodiments without materially departing from the novel teachings of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as to other embodiments, are intended to be included within the scope of the appended claims.

What is claimed is:

1. A scan driver comprising a plurality of stages, each stage comprising:
   at least one clock line configured to receive a first clock signal and a second clock signal having different phases;
   a shared input circuit configured to transfer an input signal to a shared control node;
   a first output circuit coupled to the shared control node, configured to transfer a voltage of the shared control node to a first control node, and configured to output a first scan signal in response to a voltage of the first control node and the first clock signal; and
   a second output circuit coupled to the shared control node, configured to transfer the voltage of the shared control node to a second control node, and configured to output a second scan signal in response to a voltage of the second control node and the second clock signal,
   wherein the shared input circuit includes: a first transistor including a gate receiving the second clock signal, a first terminal receiving the input signal, and a second terminal coupled to the shared control node.

2. The scan driver of claim 1,
   wherein the first output circuit and the second output circuit are commonly coupled to a shared inverted control node,
   wherein the first output circuit transfers a gate-off voltage to a first output node at which the first scan signal is output in response to a voltage of the shared inverted control node, and
   wherein the second output circuit transfers the gate-off voltage to a second output node at which the second scan signal is output in response to the voltage of the shared inverted control node.

3. The scan driver of claim 1, wherein the first output circuit includes:
   a second transistor including a gate receiving a gate-on voltage, a first terminal coupled to the shared control node, and a second terminal coupled to the first control node;
   a third transistor including a gate coupled to the first control node, a first terminal receiving the first clock signal, and a second terminal coupled to a first output node at which the first scan signal is output;
   a first capacitor including a first electrode coupled to the first control node, and a second electrode coupled to the first output node; and
   a fourth transistor including a gate coupled to a shared inverted control node, a first terminal coupled to the first output node, and a second terminal receiving a gate-off voltage.

4. The scan driver of claim 1, wherein the second output circuit includes:
   a fifth transistor including a gate receiving the first clock signal, a first terminal coupled to the shared control node, and a second terminal coupled to the second control node;
   a sixth transistor including a gate coupled to the second control node, a first terminal receiving the second clock signal, and a second terminal coupled to a second output node at which the second scan signal is output;
   a second capacitor including a first electrode coupled to the second control node, and a second electrode coupled to the second output node; and
   a seventh transistor including a gate coupled to a shared inverted control node, a first terminal coupled to the second output node, and a second terminal receiving a gate-off voltage.

5. The scan driver of claim 4, wherein the second output circuit further includes: a thirteenth transistor coupled between the second terminal of the fifth transistor and the second control node, and including a gate receiving a gate-on voltage, a first terminal coupled to the second terminal of the fifth transistor, and a second terminal coupled to the second control node.

6. The scan driver of claim 1, wherein each stage further comprises: a shared stabilizer circuit configured to transfer a gate-off voltage to the shared control node in response to a voltage of a shared inverted control node.

7. A scan driver comprising a plurality of stages, each stage comprising:
- at least one clock line configured to receive a first clock signal and a second clock signal having different phases;
- a shared input circuit configured to transfer an input signal to a shared control node;
- a first output circuit coupled to the shared control node, configured to transfer a voltage of the shared control node to a first control node, and configured to output a first scan signal in response to a voltage of the first control node and the first clock signal; and
- a second output circuit coupled to the shared control node, configured to transfer the voltage of the shared control node to a second control node, and configured to output a second scan signal in response to a voltage of the second control node and the second clock signal,
- wherein each stage further comprises: a shared stabilizer circuit configured to transfer a gate-off voltage to the shared control node in response to a voltage of a shared inverted control node,
- wherein the shared stabilizer circuit includes: an eighth transistor including a gate coupled to the shared inverted control node, a first terminal coupled to the shared control node, and a second terminal receiving the gate-off voltage.

8. The scan driver of claim 7, wherein the shared input circuit includes: a first transistor including a gate receiving the input signal, a first terminal receiving the input signal, and a second terminal coupled to the shared control node.

9. The scan driver of claim 7, wherein each stage further comprises: a shared inverter circuit configured to control a shared inverted control node in response to the first clock signal and the first scan signal.

10. The scan driver of claim 9, wherein the shared inverter circuit includes:
- a ninth transistor including a gate receiving the first clock signal, a first terminal receiving the first clock signal, and a second terminal;
- a tenth transistor including a gate coupled to the second terminal of the ninth transistor, a first terminal receiving the first clock signal, and a second terminal coupled to the shared inverted control node;
- an eleventh transistor including a gate coupled to a first output node at which the first scan signal is output, a first terminal coupled to the gate of the tenth transistor, and a second terminal receiving a gate-off voltage; and
- a twelfth transistor including a gate coupled to the first output node, a first terminal coupled to the shared inverted control node, and a second terminal receiving the gate-off voltage.

11. The scan driver of claim 7, wherein each stage further comprises: a shared inverter circuit configured to control a shared inverted control node in response to the first clock signal and the voltage of the shared control node.

12. The scan driver of claim 11, wherein the shared inverter circuit includes:
- a ninth transistor including a gate receiving the first clock signal, a first terminal receiving the first clock signal, and a second terminal;
- a tenth transistor including a gate coupled to the second terminal of the ninth transistor, a first terminal receiving the first clock signal, and a second terminal coupled to the shared inverted control node;
- an eleventh transistor including a gate coupled to the shared control node, a first terminal coupled to the gate of the tenth transistor, and a second terminal receiving a gate-off voltage;
- a twelfth transistor including a gate coupled to the shared control node, a first terminal coupled to the shared inverted control node, and a second terminal receiving the gate-off voltage; and
- a third capacitor including a first electrode coupled to the shared inverted control node, and a second electrode receiving the gate-off voltage.

13. The scan driver of claim 7, wherein transistors included in at least one of the first output circuit or the second output circuit of the scan driver are NMOS transistors, and transistors included in at least the other of the first output circuit or the second output circuit are PMOS transistors.

14. The scan driver of claim 11, wherein transistors included in at least one of the shared input circuit, the shared stabilizer circuit or the shared inverter circuit of the scan driver are PMOS transistors, and transistors included in at least another of the shared input circuit, the shared stabilizer circuit or the shared inverter circuit are NMOS transistors.

15. A scan driver comprising a plurality of stages, each stage comprising:
- at least one clock line configured to receive a first clock signal and a second clock signal having different phases;
- a first transistor including a gate receiving an input signal or the second clock signal, a first terminal receiving the input signal, and a second terminal coupled to a shared control node;
- a second transistor including a gate receiving a gate-on voltage, a first terminal coupled to the shared control node, and a second terminal coupled to a first control node;
- a third transistor including a gate coupled to the first control node, a first terminal receiving the first clock signal, and a second terminal coupled to a first output node at which a first scan signal is output;
- a first capacitor including a first electrode coupled to the first control node, and a second electrode coupled to the first output node;
- a fourth transistor including a gate coupled to a shared inverted control node, a first terminal coupled to the first output node, and a second terminal receiving a gate-off voltage;
- a fifth transistor including a gate receiving the first clock signal, a first terminal coupled to the shared control node, and a second terminal coupled to a second control node;
- a sixth transistor including a gate coupled to the second control node, a first terminal receiving the second clock signal, and a second terminal coupled to a second output node at which a second scan signal is output;
- a second capacitor including a first electrode coupled to the second control node, and a second electrode coupled to the second output node; and
- a seventh transistor including a gate coupled to the shared inverted control node, a first terminal coupled to the second output node, and a second terminal receiving the gate-off voltage.

16. The scan driver of claim 15, wherein each stage further comprises:

an eighth transistor including a gate coupled to the shared inverted control node, a first terminal coupled to the shared control node, and a second terminal receiving the gate-off voltage;
a ninth transistor including a gate receiving the first clock signal, a first terminal receiving the first clock signal, and a second terminal;
a tenth transistor including a gate coupled to the second terminal of the ninth transistor, a first terminal receiving the first clock signal, and a second terminal coupled to the shared inverted control node;
an eleventh transistor including a gate coupled to the first output node, a first terminal coupled to the gate of the tenth transistor, and a second terminal receiving the gate-off voltage; and
a twelfth transistor including a gate coupled to the first output node, a first terminal coupled to the shared inverted control node, and a second terminal receiving the gate-off voltage.

17. The scan driver of claim 15, wherein each stage further comprises:
a thirteenth transistor coupled between the second terminal of the fifth transistor and the second control node, and including a gate receiving the gate-on voltage, a first terminal coupled to the second terminal of the fifth transistor, and a second terminal coupled to the second control node.

18. The scan driver of claim 15, wherein each stage further comprises:
an eighth transistor including a gate coupled to the shared inverted control node, a first terminal coupled to the shared control node, and a second terminal receiving the gate-off voltage;
a ninth transistor including a gate receiving the first clock signal, a first terminal receiving the first clock signal, and a second terminal;
a tenth transistor including a gate coupled to the second terminal of the ninth transistor, a first terminal receiving the first clock signal, and a second terminal coupled to the shared inverted control node;
an eleventh transistor including a gate coupled to the shared control node, a first terminal coupled to the gate of the tenth transistor, and a second terminal receiving the gate-off voltage;
a twelfth transistor including a gate coupled to the shared control node, a first terminal coupled to the shared inverted control node, and a second terminal receiving the gate-off voltage; and
a third capacitor including a first electrode coupled to the shared inverted control node, and a second electrode receiving the gate-off voltage.

19. The scan driver of claim 7, wherein the first output circuit includes:
a second transistor including a gate receiving a gate-on voltage, a first terminal coupled to the shared control node, and a second terminal coupled to the first control node;
a third transistor including a gate coupled to the first control node, a first terminal receiving the first clock signal, and a second terminal coupled to a first output node at which the first scan signal is output;
a first capacitor including a first electrode coupled to the first control node, and a second electrode coupled to the first output node; and
a fourth transistor including a gate coupled to a shared inverted control node, a first terminal coupled to the first output node, and a second terminal receiving a gate-off voltage.

20. The scan driver of claim 7, wherein the second output circuit includes:
a fifth transistor including a gate receiving the first clock signal, a first terminal coupled to the shared control node, and a second terminal coupled to the second control node;
a sixth transistor including a gate coupled to the second control node, a first terminal receiving the second clock signal, and a second terminal coupled to a second output node at which the second scan signal is output;
a second capacitor including a first electrode coupled to the second control node, and a second electrode coupled to the second output node; and
a seventh transistor including a gate coupled to a shared inverted control node, a first terminal coupled to the second output node, and a second terminal receiving a gate-off voltage.

* * * * *